(12) United States Patent
Furuta et al.

(10) Patent No.: US 11,258,376 B2
(45) Date of Patent: Feb. 22, 2022

(54) VIBRATION WAVE MOTOR, DRIVE CONTROL SYSTEM, OPTICAL APPARATUS, AND ELECTRONIC APPARATUS

(71) Applicant: CANON KABUSHIKI KAISHA, Tokyo (JP)

(72) Inventors: Tatsuo Furuta, Machida (JP); Akira Uebayashi, Tokyo (JP); Tomohiro Watanabe, Yokohama (JP); Shinya Koyama, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 543 days.

(21) Appl. No.: 16/174,898

(22) Filed: Oct. 30, 2018

(65) Prior Publication Data

US 2019/0140558 A1 May 9, 2019

(30) Foreign Application Priority Data

Nov. 6, 2017 (JP) .............................. JP2017-214156
Sep. 28, 2018 (JP) .............................. JP2018-185422

(51) Int. Cl.
*H02N 2/00* (2006.01)
*H01L 41/04* (2006.01)
(Continued)

(52) U.S. Cl.
CPC .............. *H02N 2/001* (2013.01); *G02B 7/08* (2013.01); *H01L 41/047* (2013.01); *H01L 41/113* (2013.01); *H01L 41/187* (2013.01); *H01L 41/1871* (2013.01); *H02N 2/005* (2013.01); *H02N 2/0075* (2013.01); *H02N 2/163* (2013.01); *H04N 5/2254* (2013.01); *G02B 7/026* (2013.01)

(58) Field of Classification Search
CPC ...... H02N 2/001; H02N 2/005; H02N 2/0075; H02N 2/163; H01L 41/047

USPC ....................................... 310/323.01–323.21
See application file for complete search history.

(56) References Cited

U.S. PATENT DOCUMENTS

| | | | |
|---|---|---|---|
| 6,674,217 B1* | 1/2004 | Fujimoto | H02N 2/106 310/323.04 |
| 2013/0335085 A1* | 12/2013 | Arimitsu | H02N 2/163 324/318 |
| 2014/0125199 A1* | 5/2014 | Furuta | H01L 41/047 310/323.06 |

FOREIGN PATENT DOCUMENTS

| | | |
|---|---|---|
| JP | 6-153541 A | 5/1994 |
| JP | 5322431 B2 | 10/2013 |

OTHER PUBLICATIONS

Saburo Nagakura, Hiroo Inokuchi, Hiroshi Ezawa, Hiizu Iwamura, Fumitakasato, Ryogo Kubo; "Iwanami Physicochemical Dictionary, Fifth Edition," pp. 1-3.

* cited by examiner

*Primary Examiner* — Derek J Rosenau
(74) *Attorney, Agent, or Firm* — Canon U.S.A., Inc. IP Division

(57) ABSTRACT

A vibration wave motor includes a driven body, a vibrator including an annular vibration plate and an annular piezoelectric element, and a vibration damping member, which are arranged in sequence, wherein the vibration plate has, on a side facing the driven body, radially extending groove portions at X places, and, when center depths of the groove portions at X places are sequentially denoted by D1 to DX in a circumferential direction, D1 to DX vary along a curve obtained by superposing one or more sine waves, and wherein the vibration plate is locally supported by the vibration damping member in some or all antinode portions of a standing wave occurring when the vibration wave motor is driven.

12 Claims, 19 Drawing Sheets

(51) Int. Cl.
*H01L 41/047* (2006.01)
*H01L 41/187* (2006.01)
*H01L 41/113* (2006.01)
*H02N 2/16* (2006.01)
*H04N 5/225* (2006.01)
*G02B 7/08* (2021.01)
*G02B 7/02* (2021.01)

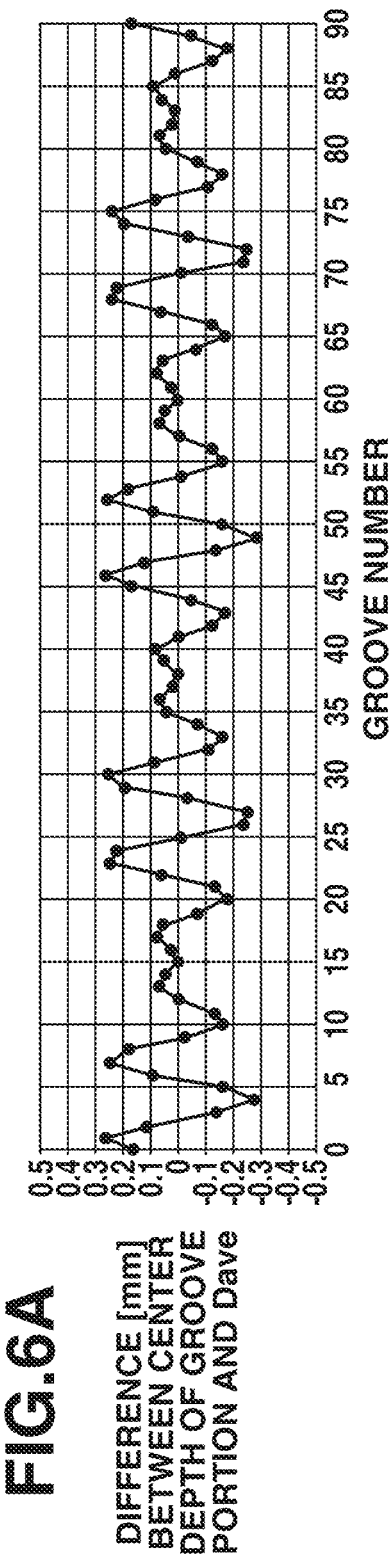
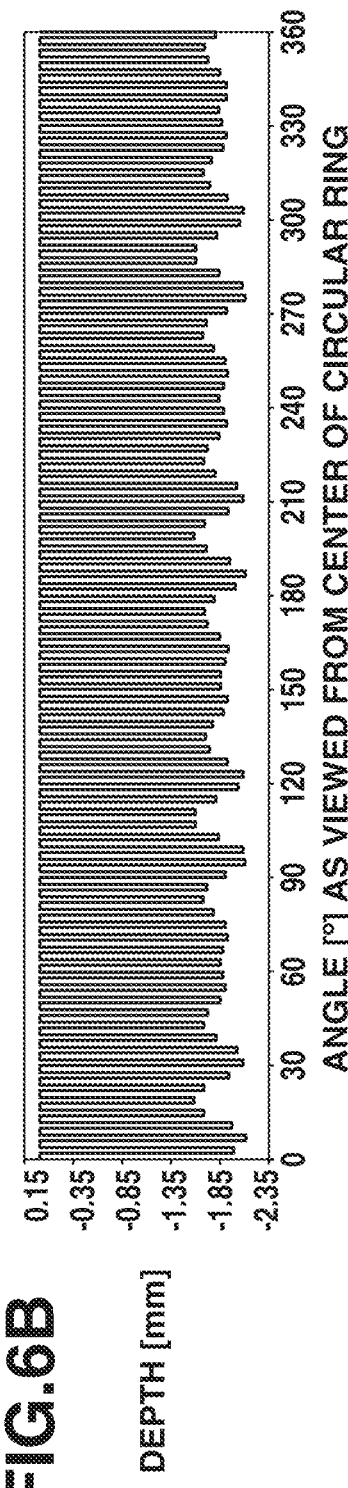
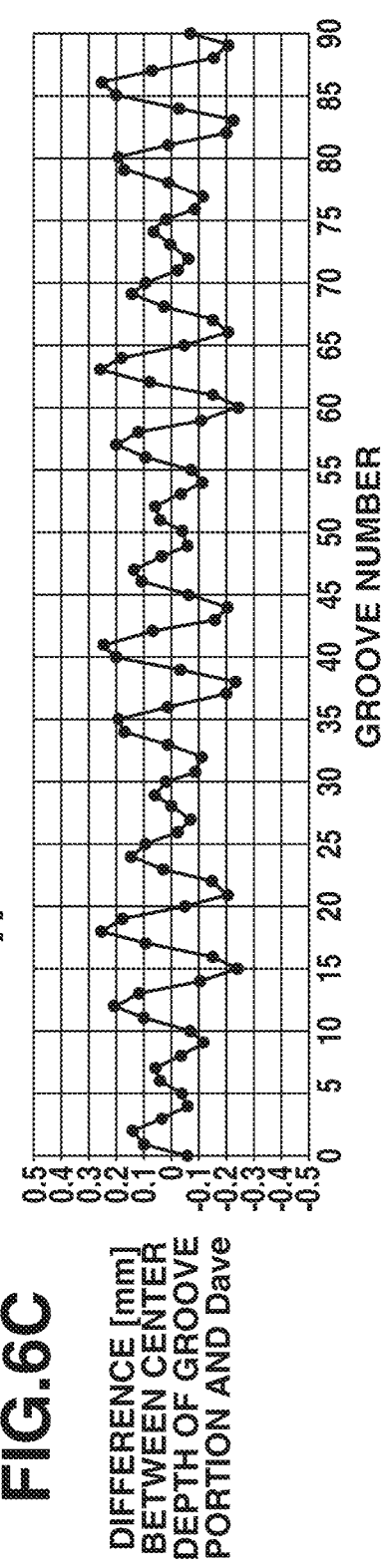
FIG.6A
FIG.6B
FIG.6C

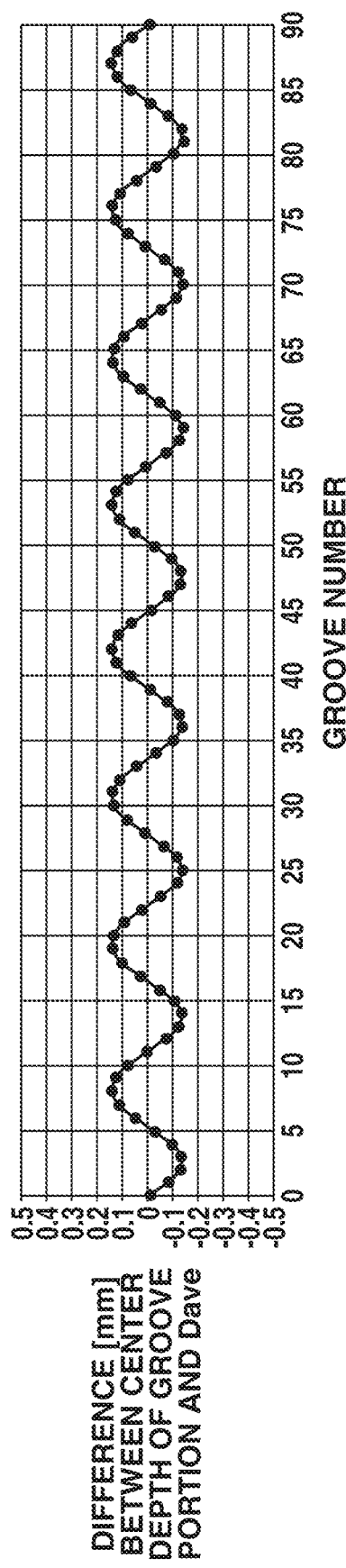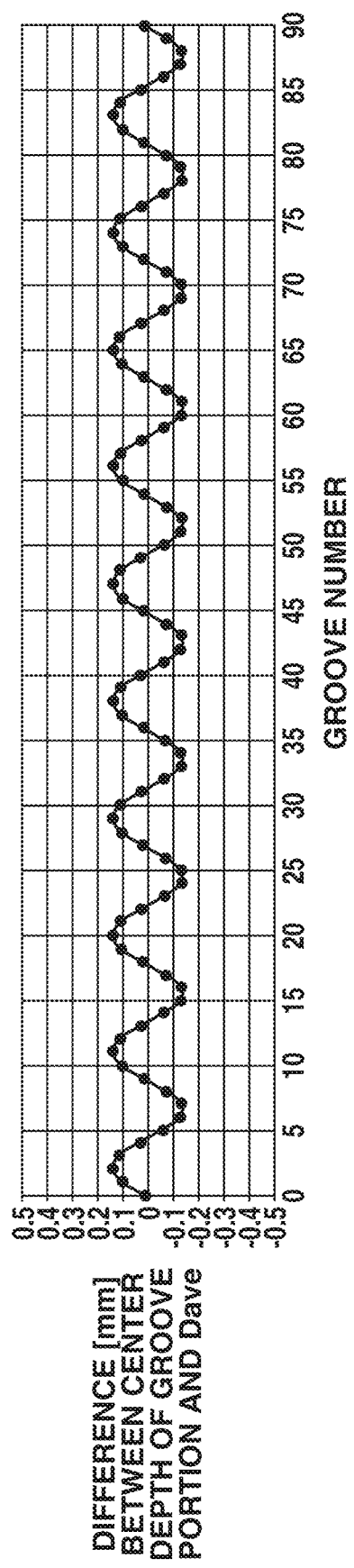

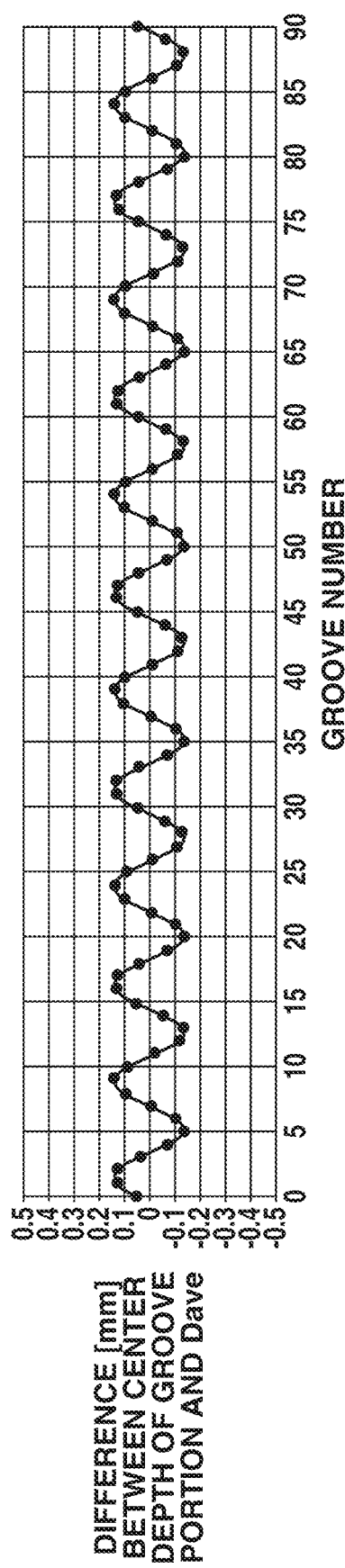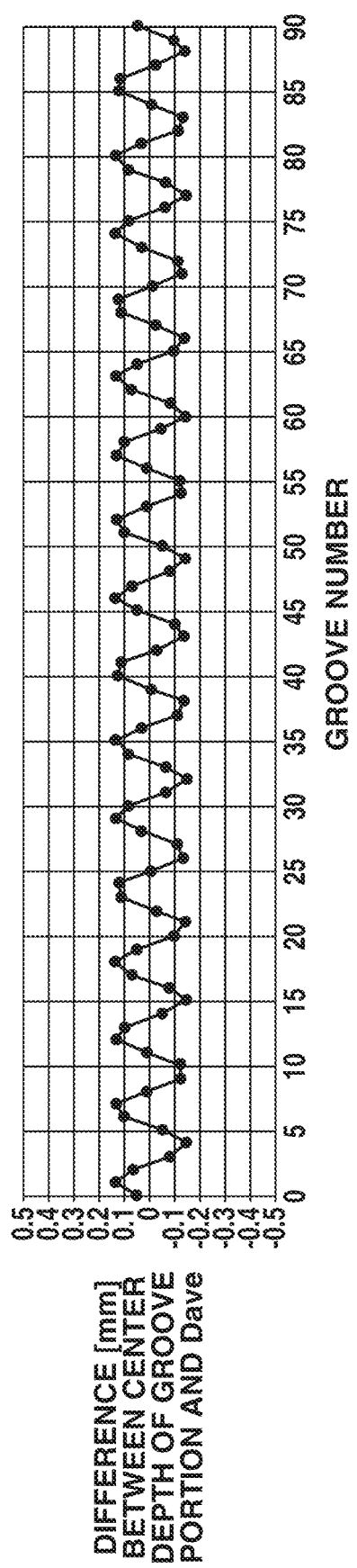

101a 1011  101  1012

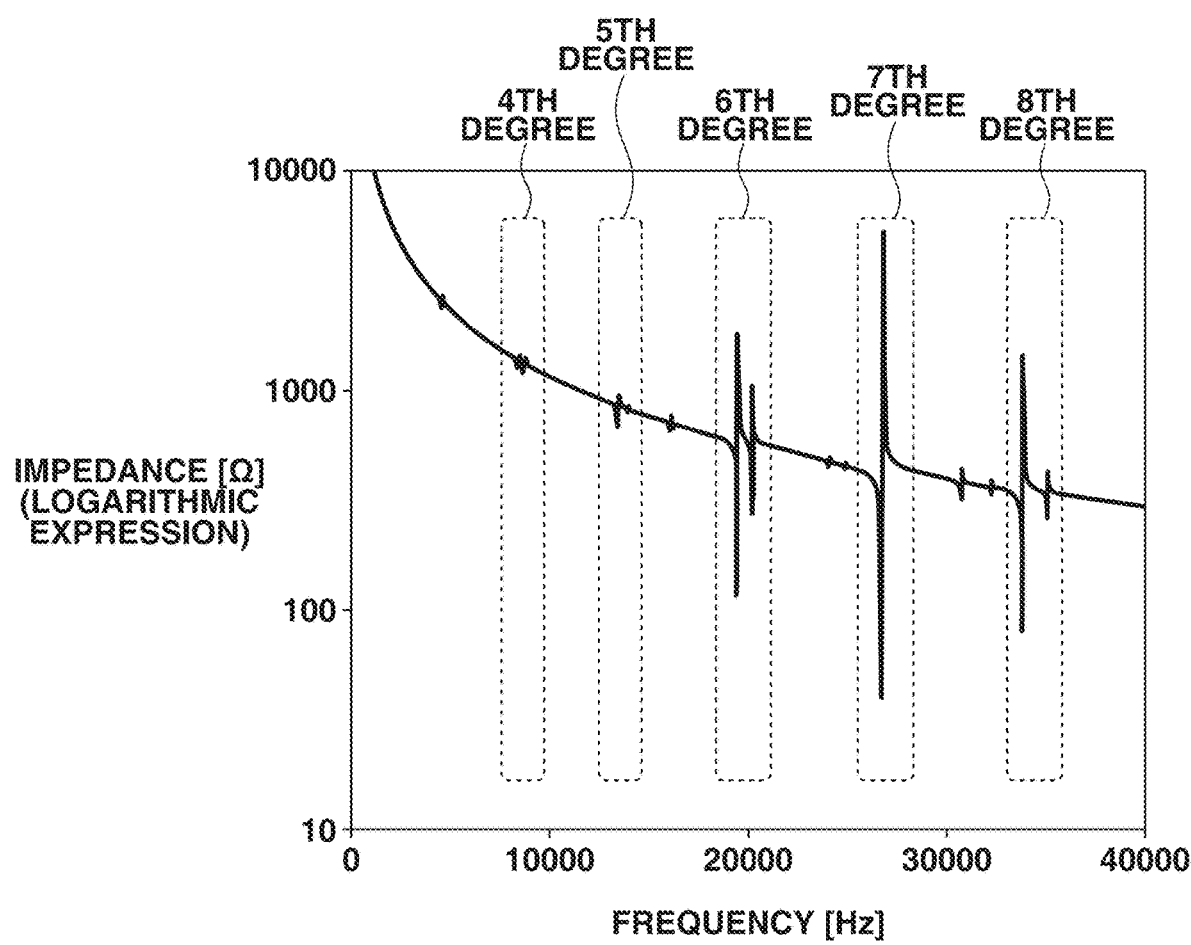

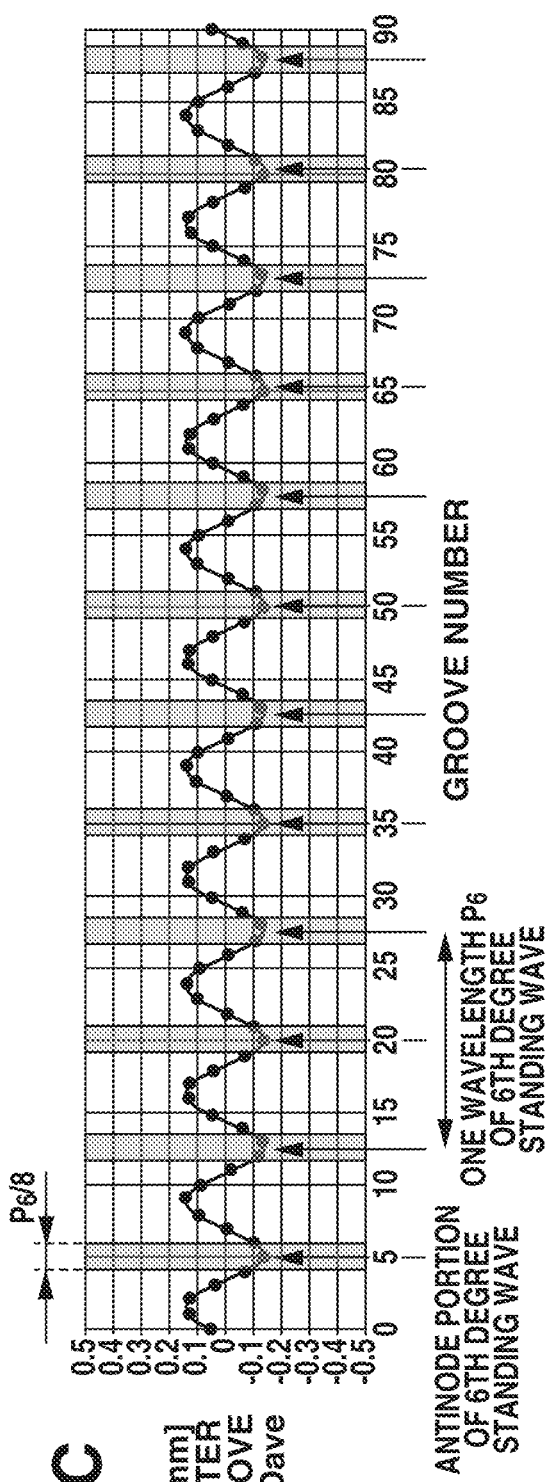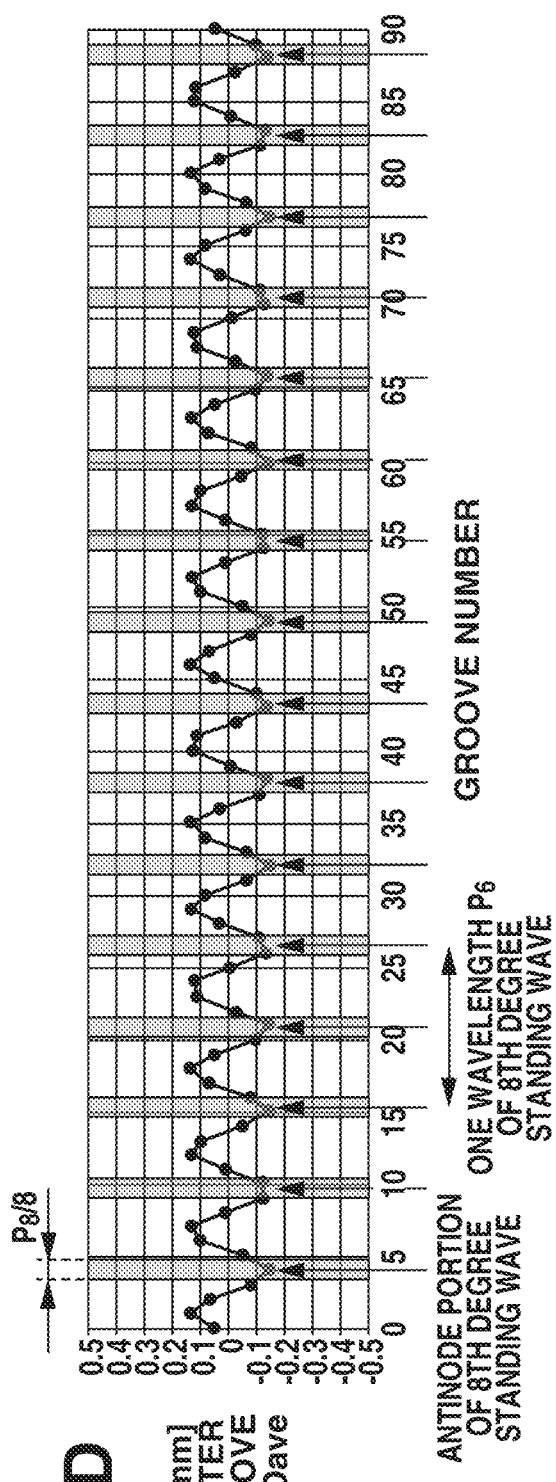

VIBRATION WAVE MOTOR, DRIVE CONTROL SYSTEM, OPTICAL APPARATUS, AND ELECTRONIC APPARATUS

BACKGROUND

Field of the Disclosure

Aspects of the present disclosure generally relate to a vibration wave motor and a drive control system, an optical apparatus, and an electronic apparatus, each of which uses the vibration wave motor.

Description of the Related Art

A vibration type (vibration wave) actuator includes a vibrator, which is configured with an electro-mechanical energy conversion element, such as a piezoelectric element; an elastic body; and a driven body that is in pressed contact with the vibrator. The vibration type actuator is used as a vibration wave motor, which uses friction caused by a drive force of a vibration excited by the vibrator to relatively move the driven body.

The outline of a structure and a drive principle of an annular vibration wave motor, which is a typical utilization form of the vibration type actuator, is described as follows. Furthermore, when the term "annular" is used in the following description, the form of an article or a member concerned can be deemed to be a form in which a circular disk with a predetermined thickness has a concentric through-hole. Hereinafter, the length of the circular disk along the through-hole thereof is referred to as the "thickness" of the circular disk, and both surfaces which define the thickness of the circular disk are referred to as "surfaces".

The annular vibration wave motor includes an annular vibrator and an annular driven body, which is brought into pressed contact with the vibrator by a pressure member. A vibration damping member is provided between the vibrator and the pressure member to prevent the vibration of the vibrator from being transmitted to the pressure member.

The driven body is composed of an elastic body, and the material thereof is usually metal. The vibrator includes an annular vibration plate and an annular piezoelectric element, which is provided on one surface of the vibration plate. The vibration plate is composed of an elastic body, and the material thereof is usually metal. The piezoelectric element includes, on one surface of annular piezoelectric ceramics, electrodes divided into a plurality of regions obtained by equally dividing the circumference into n parts (n being a natural number) along the circumferential direction of the circular ring, and, on the other surface thereof, a common electrode. In terms of the length $\lambda$, the circumferential length is expressed by $n\lambda$. The material of the piezoelectric ceramic is usually a lead zirconate titanate based material.

The electrodes divided into a plurality of regions are respectively provided at two regions which constitute drive phase electrodes, at least one region which constitutes a detection phase electrode, and regions which constitute non-drive phase electrodes that are provided as needed.

With respect to two drive phase electrodes, poling processing is applied by alternately applying opposite electric fields at a pitch of $\lambda/2$ along the circumferential direction. Therefore, the expansion and contraction polarity of the piezoelectric ceramics is alternately reversed at a pitch of $\lambda/2$ with respect to the applied voltage. Moreover, two regions (interval portions) which separate two regions which constitute the respective drive phase electrodes at intervals of an odd number multiple of $\lambda/4$ are provided with non-drive phase electrodes short-circuited to the common electrode. The interval portion is usually provided with a detection phase electrode described below.

When alternating voltages are applied to the drive phase electrodes of such a vibration wave motor, a first standing wave and a second standing wave with a wavelength of $\lambda$ occur over the entire circumference of the vibrator. The second standing wave is a wave rotationally moved by $\lambda/4$ in the circumferential direction with respect to the first standing wave.

On the other hand, when two types of alternating voltages which are equal in frequency and a temporal phase difference of which is $\pi/2$ are applied to the respective drive phase electrodes, standing waves of both sides are combined. As a result, in the vibrator, a traveling wave (the wave number n along the circular ring and the wavelength $\lambda$) with a bending vibration traveling in the circumferential direction along the entire circumference (the vibration in which the amplitude is perpendicular to the surface of the vibrator) occurs.

A driven body that is in contact with the surface in which a traveling wave with a bending vibration (hereinafter referred to simply as a "bending vibration wave") has occurred is driven by receiving a frictional force (drive force) in the circumferential direction from the vibration plate.

However, a bending vibration wave of the degree different from the n-th degree (wavenumber n) previously set during driving, such as a traveling wave with the bending vibration of the (n−1)-th degree or (n+1)-th degree, may occur. These bending vibration waves other than the set bending vibration wave are referred to as "unnecessary traveling waves". The causes for occurrence of unnecessary traveling waves include, for example, the low accuracy of a contact surface between the vibrator and the driven body, the unevenness of a mechanical vibration occurring in the driven body, and the non-uniformity of a distribution of contact pressures between the vibrator and the driven body. If unnecessary traveling waves occur when the vibration wave motor is driven, this causes abnormal noise or power reduction due to the unnecessary traveling waves.

Therefore, as a method for reducing the occurrence of unnecessary traveling waves, Japanese Patent No. 5,322,431 appears to discuss a configuration in which grooves are radially formed on the surface of a vibration plate at a side that is in contact with an annular driven body and the depth of each groove varies along a sine wave curve. Apparently, in the configuration discussed in Japanese Patent No. 5,322,431, since the depth of each groove varies along a sine wave curve, traveling waves that are not needed (unnecessary traveling waves) are prevented or reduced.

However, if the depth of each groove is configured to vary as mentioned above, the thickness of the vibration plate in a portion in which the depth of the groove is large becomes relatively small. Therefore, the vibration amplitude of a standing wave, in which the portion in which the depth of the groove is large and corresponds to the antinode of the vibration, becomes large. Such standing waves (unnecessary standing waves) make no contribution to rotating the vibration wave motor and become a cause of the occurrence of abnormal noise or power reduction.

On the other hand, apparently in a configuration discussed in Japanese Patent Application Laid-Open No. 6-153541, while a separated supporting member is used to stably fix a vibrator, since the depth of each groove is not configured to vary along a sine wave curve, unnecessary traveling waves are likely to occur although unnecessary standing waves do not occur. Moreover, there appears to be no discussion about the position in the circumferential direction of the vibrator at which the supporting member is mounted.

SUMMARY

Some aspects of the present disclosure generally provide a vibration wave motor that is capable of exerting a sufficient driving speed and in which both unnecessary traveling waves and unnecessary standing waves are prevented or reduced from occurring, and provide a drive control system, an optical apparatus, and an electronic apparatus, each of which uses the vibration wave motor.

According to some embodiments, a vibration wave motor includes a driven body, a vibrator including an annular vibration plate and an annular piezoelectric element, and a vibration damping member, which are arranged in sequence, wherein the annular vibration plate has, on a side facing the driven body, a plurality of groove portions extending radially from a center of the vibration plate, at least one of the plurality of grooves is different in depth, and the annular vibration plate is pressed by the vibration damping member in a non-uniform manner.

According to some embodiments, a drive control system includes the above-mentioned vibration wave motor.

According to some embodiments, an optical apparatus includes the above-mentioned drive control system.

According to some embodiments, an electronic apparatus includes the above-mentioned vibration wave motor.

According to some embodiments, in a vibration wave motor or in a drive control system and an optical apparatus, each of which uses the vibration wave motor, while a sufficient drive speed is exerted, unnecessary traveling waves and unnecessary standing waves can be effectively prevented or reduced from occurring.

Further features of various embodiments will become apparent from the following description of exemplary embodiments with reference to the attached drawings.

BRIEF DESCRIPTION OF THE DRAWINGS

FIGS. 6A, 6B, 6C, 6D, 6E, and 6F are schematic views illustrating distributions of the center depth of a groove portion of the vibration plate in the vibration wave motor according to the exemplary embodiment.

FIGS. 7A, 7B, 7C, and 7D are schematic views illustrating distributions of the center depth of a groove portion of the vibration plate in the vibration wave motor according to the exemplary embodiment.

FIG. 14 is a diagram illustrating an example of an impedance curve of a vibrator which is used in a vibration wave motor according to an exemplary embodiment.

FIGS. 15A, 15B, 15C, and 15D are schematic views illustrating mounting positions of a vibration damping member which is used in a vibration wave motor according to an exemplary embodiment.

DESCRIPTION OF THE EMBODIMENTS

Various exemplary embodiments of a vibration wave motor, a drive control system, and an optical apparatus will be described below with reference to the drawings.

<Vibration Wave Motor and Vibrator Usable for Vibration Wave Motor>

A vibration wave motor according to an exemplary embodiment includes a driven body, a vibrator including an annular vibration plate and an annular piezoelectric element, and a vibration damping member, which are arranged in sequence, wherein the annular vibration plate has, on a side facing the driven body, a plurality of groove portions extending radially from a center of the vibration plate and differing in depth, and is pressed by the vibration damping member in a non-uniform manner.

Moreover, a vibration wave motor according to an exemplary embodiment includes a driven body, a vibrator including an annular vibration plate and an annular piezoelectric element, and a vibration damping member, which are arranged in sequence, wherein the annular vibration plate has, on a side facing the driven body, radially extending groove portions at X places, in which, when the center depths of the groove portions at X places are sequentially denoted by D1 to DX, D1 to DX vary along a curve obtained by superposing one or more sine waves, and the annular vibration plate is pressed more strongly by the vibration damping member in part or all of the antinodes of a standing wave which occurs when the vibration wave motor is driven than in portions other than the antinodes of the standing wave.

Figure 1A:
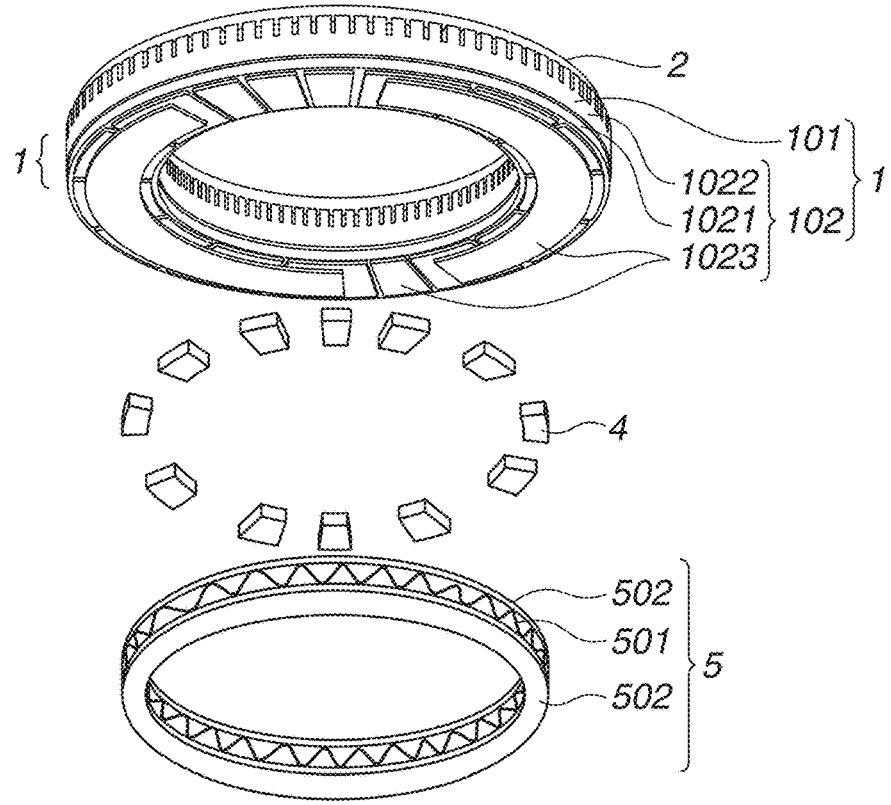
FIGS. 1A and 1B are schematic views illustrating a vibration wave motor according to an exemplary embodiment.
Figure 1B:
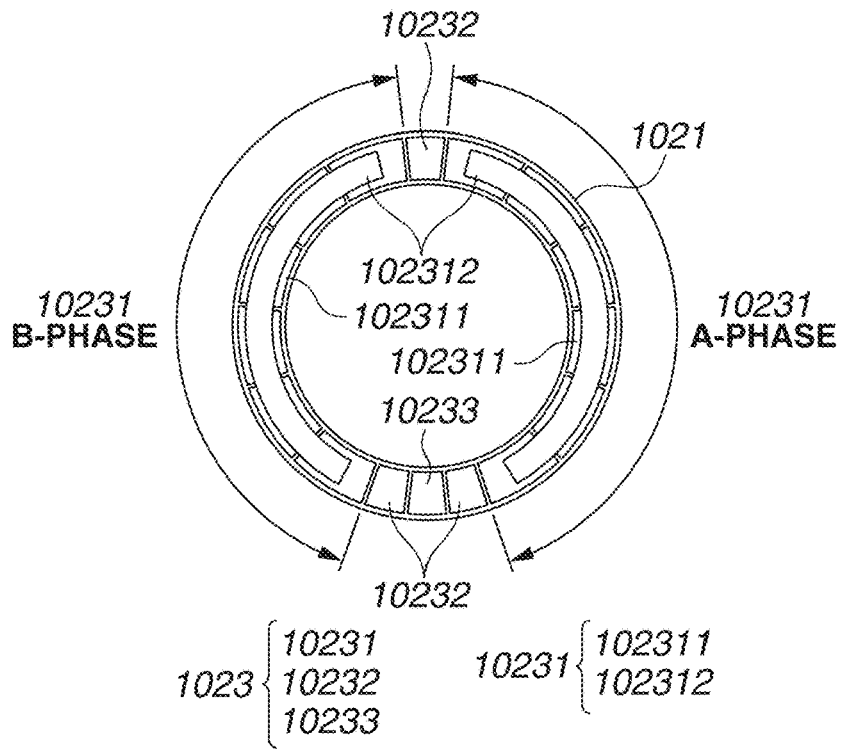
Figure 2:
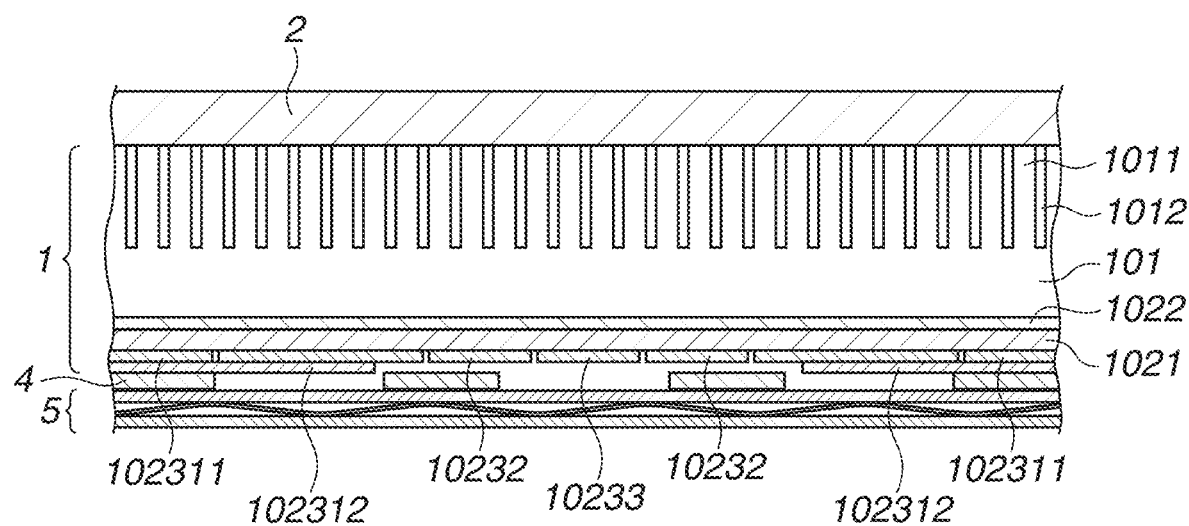
FIG. 2 is a schematic sectional view selectively illustrating a configuration of a portion of the vibration wave motor according to the exemplary embodiment.

FIGS. 1A and 1B are schematic views illustrating a vibration wave motor according to an exemplary embodiment. FIG. 1A is a schematic perspective view of the vibration wave motor as viewed from an oblique direction, and FIG. 1B is a schematic plan view of the vibration wave motor as viewed from a side on which a plurality of electrodes (pattern electrodes) is provided. However, FIG. 1B is drawn as a see-through view, in which a vibration damping member 4 and a pressure member 5 are omitted from illustration. Moreover, FIG. 2 is a schematic fragmentary sectional side view of a detailed configuration of the vibration wave motor as viewed from a lateral side according to the exemplary embodiment. The term "lateral side" as used here is a position away from the circular ring in a radial direction. As illustrated in FIG. 1A, the vibration wave motor according to the exemplary embodiment includes a vibrator 1, a driven body 2, a vibration damping member 4, and a pressure member 5. Moreover, the vibrator 1 includes an annular vibration plate 101 and an annular piezoelectric element 102, which is provided on a first surface of the vibration plate 101 (a side facing the piezoelectric element 102).

<Annular>

In the present exemplary embodiment, the term "annular" is used to refer to a form in which a circular disk with a predetermined thickness has a concentric through-hole, as mentioned above. Ideally, the outer circumferential shape of each of the circular disk and the through-hole is an exact circle, but includes, for example, an ellipse and an oval as long as it is able to be schematically deemed to be a circle. The radius or diameter in a case where the circle is not an exact circle is determined based on a supposed exact circle having the same area. A shape in which a part of the circular ring is chipped or an approximate annular shape, such as a shape in which a part of the circular ring is protruded, is included in an annular shape in the present exemplary embodiment as long as it is able to be deemed to be substantially annular. Accordingly, an approximate annular shape slightly deformed by manufacturing variations is also included in an annular shape in the present exemplary embodiment as long as it is able to be deemed to be still substantially annular. The radius or diameter in a case where the circle is an approximate annular shape is determined based on a supposed exact circle having its defect part or abnormal part corrected.

<Vibration Damping Member>

The vibration damping member 4 is provided on the surface of the piezoelectric element 102, as illustrated in FIG. 1A. Since the vibration damping member 4 is provided as separate members or is made non-uniform in thickness, antinode portions of an unnecessary standing wave are locally restrained and are pressed more strongly than portions other than antinode portions of a standing wave, so that the amplitude of the unnecessary standing wave can be reduced. More specifically, by the vibration damping member 4 pressing in a non-uniform manner, the amplitude of the unnecessary standing wave can be reduced. In a case where at least one of the plurality of grooves is different in depth, the positions of antinode portions are always fixed, so that portions of a large amplitude which are antinode portions of the standing wave can be locally and continuously restrained.

The vibration damping member 4 is made from a material having a vibration isolation property (vibration-free property), in which the vibration of the vibrator 1 is unlikely to be transmitted to the pressure member 5, and, for example, felt, fabric, rubber, cork, or resin can be used as the material. Among these materials, felt is high in vibration isolation property and inexpensive and, therefore, felt is often a favorable material.

<Pressure Member>

The pressure member 5 is a member which presses the vibration plate 101 toward the driven body 2 via the vibration damping member 4 by application of pressure, so that a predetermined force is applied between the second surface of the vibration plate 101 (a side facing the driven body 2) and the driven body 2. Fixing the pressure member 5 in a pressing manner enables the application of an optional force between the second surface of the vibration plate 101 and the driven body 2.

Furthermore, in the vibration wave motor according to the present exemplary embodiment, the pressure member 5 is provided as separate members, is made non-uniform in thickness, or is provided with uneven portions so that antinode portions of an unnecessary standing wave of the vibrator 1 are locally restrained via the vibration damping member 4. And, by pressing the pressure member 5 in an uneven manner, the amplitude of the unnecessary standing wave can be reduced.

The pressure member 5 can be configured by superposing a spring 501, such as a wave washer which generates a load by warping a plane washer in an arching line or a disc spring, and annular flat plates 502, as illustrated in FIG. 1A.

<Vibrator>

As illustrated in FIG. 1A, the vibrator 1 includes an annular vibration plate 101 and an annular piezoelectric element 102, and the vibrator 1 is in contact with the driven body 2. The piezoelectric element 102 is made from a piezoelectric material and electrodes. In a case where the outer circumference of the vibration plate 101 has a plurality of outer diameters depending on measurement places, the maximum outer diameter is assumed to be 2R. In some embodiments, the first surface of the vibration plate 101 is a flat surface, because the transmission of a vibration caused by expansion and contraction of the piezoelectric element 102 can be appropriately performed. While the method for providing the piezoelectric element 102 on the first surface of the vibration plate 101 is not limited, tightly attaching them to each other in such a way as not to hinder transmission of a vibration or bonding them via a highly elastic adhesive layer (not illustrated) may be favorable. For example, in some embodiments epoxy system resin is used as an adhesive layer.

<Driven Body>

The annular driven body 2 is brought into pressed contact with the annular vibrator 1 by the pressure member 5, and is thus rotated by a drive force brought about by friction caused by a traveling wave occurring at a contact surface with the vibrator 1. In some embodiments the contact surface of the driven body 2 with the vibrator 1 is a plane. In some embodiments the driven body 2 is made from metal. For example, in some embodiments aluminum is used as the material of the driven body 2.

<Configuration of Piezoelectric Element>

As illustrated in FIG. 1A, the annular piezoelectric element 102 includes an annular piece of piezoelectric ceramics 1021; a common electrode 1022, which is provided on one surface of the piece of piezoelectric ceramics 1021; and a plurality of electrodes 1023, which are provided on the other surface of the piece of piezoelectric ceramics 1021.

In the present exemplary embodiment, the piece of piezoelectric ceramics 1021 is a mass (bulk body) uniform in composition and having no joints, which is obtained by performing burning of base powder having metallic elements, and at least a partial region thereof is previously subjected to poling processing. The piezoelectric ceramics in the piece of piezoelectric ceramics 1021 are ceramics in which the absolute value of the piezoelectric constant d31 at room temperature is 10 pm/V or the piezoelectric constant d33 is 30 pC/N or more.

The piezoelectric constant of piezoelectric ceramics can be obtained by calculation based on Japan Electronics and Information Technology Industries Association standard (JEITA EM-4501) from measurement results of density, resonant frequency, and antiresonant frequency of the ceramics. Hereinafter, this method is referred to as a "resonance-antiresonance method". The density can be measured by, for example, Archimedes' method. The resonant frequency and antiresonant frequency can be measured by, for example, using an impedance analyzer after a pair of electrodes is provided to the ceramics.

<Content of Lead in Piezoelectric Ceramics>

In some embodiments the piece of piezoelectric ceramics 1021 contains lead less than 1000 ppm and is thus a piece of lead-free piezoelectric ceramics.

Most conventional piezoelectric ceramics are composed mostly of lead zirconate titanate. Therefore, for example, when a piezoelectric element is discarded and is then subjected to acid rain or is left unattended in an unforgiving environment, a lead component in a piece of conventional piezoelectric ceramics may seep into the soil and may cause ecological damage. However, if the content of lead is less than 1000 ppm, as in the piezoelectric ceramics in the piece of piezoelectric ceramics 1021 according to the present exemplary embodiment, the influence of a lead component on the environment can be kept low. The content of lead can be evaluated by the contained amount of lead with respect to the total weight of the piece of piezoelectric ceramics 1021 determined in quantity by fluorescent X-ray analysis (XRF) or inductivity coupled plasma (ICP) optical emission spectrometric analysis.

<Perovskite-Type Metal Oxide>

In some embodiments the principal component of the piece of piezoelectric ceramics 1021 is a metal oxide having a perovskite-type crystalline structure (a perovskite-type metal oxide).

In the present exemplary embodiment, the perovskite-type metal oxide refers to a metal oxide having a perovskite structure, which is a cubic crystal structure, as described in Iwanami Physicochemical Dictionary, the fifth edition (Iwanami Shoten, issued on Feb. 20, 1998). The metal oxide having a perovskite structure is generally expressed by a chemical formula of $ABO_3$. While the molar ratio of the B-site element to the O element is expressed as 1 to 3, even if the ratio in element content slightly deviates (for example, 1.00 to 2.94 through 1.00 to 3.06), the metal oxide can be said to be a perovskite-type metal oxide as long as the main phase thereof is a perovskite structure. The metal oxide having a perovskite structure can be determined by, for example, a structural analysis method using X-ray diffraction or electron beam diffraction.

<Common Electrode>

The common electrode 1022 is provided on one surface of the piece of annular piezoelectric ceramics 1021 facing the vibration plate 101—in other words, a surface which is in contact with the vibration plate 101 or a surface which is in contact with the above-mentioned adhesive layer. In some embodiments the common electrode 1022 is made conductive with non-drive phase electrodes 10232 (see FIG. 1B), so that a drive voltage is able to be applied to only specific regions of the plurality of electrodes 1023. The common electrode 1022 can be formed by applying a metallic paste of, for example, silver and performing drying or baking.

<Plurality of Electrodes>

As illustrated in FIG. 1B, the electrodes 1023 include two drive phase electrodes 10231, which are electrically independent from each other, one or more non-drive phase electrodes 10232, and one or more detection phase electrodes 10233.

<Detection Phase Electrode>

The detection phase electrode 10233 is provided to detect the vibration state of the vibrator 1 and feed back information about the detected vibration state to, for example, a drive circuit. A portion of the piece of piezoelectric ceramics 1021 which is in contact with the detection phase electrode 10233 is previously subjected to poling processing. Therefore, when the vibration wave motor is driven, a voltage corresponding to the magnitude of strain of the vibrator 1 is generated at the position of the detection phase electrode 10233 and is then output as a detection signal to the outside.

<Non-Drive Phase Electrode>

At least one of the non-drive phase electrodes 10232 is able to be used as a ground electrode when being made conductive with the common electrode 1022.

A portion of the piece of piezoelectric ceramics 1021 which is in contact with the non-drive phase electrodes 10232 can have residual polarization or does not need to have residual polarization. However, in a case where a portion of the piece of piezoelectric ceramics 1021 which is in contact with the non-drive phase electrodes 10232 has residual polarization, it may be favorable that the non-drive phase electrodes 10232 and the common electrode 1022 are made conductive with each other.

<Drive Phase Electrode>

As illustrated in FIG. 1B, each of the drive phase electrodes 10231 includes six polarization electrodes 102311 and a tether electrode 102312 which electrically connects the six polarization electrodes 102311.

Figure 3:
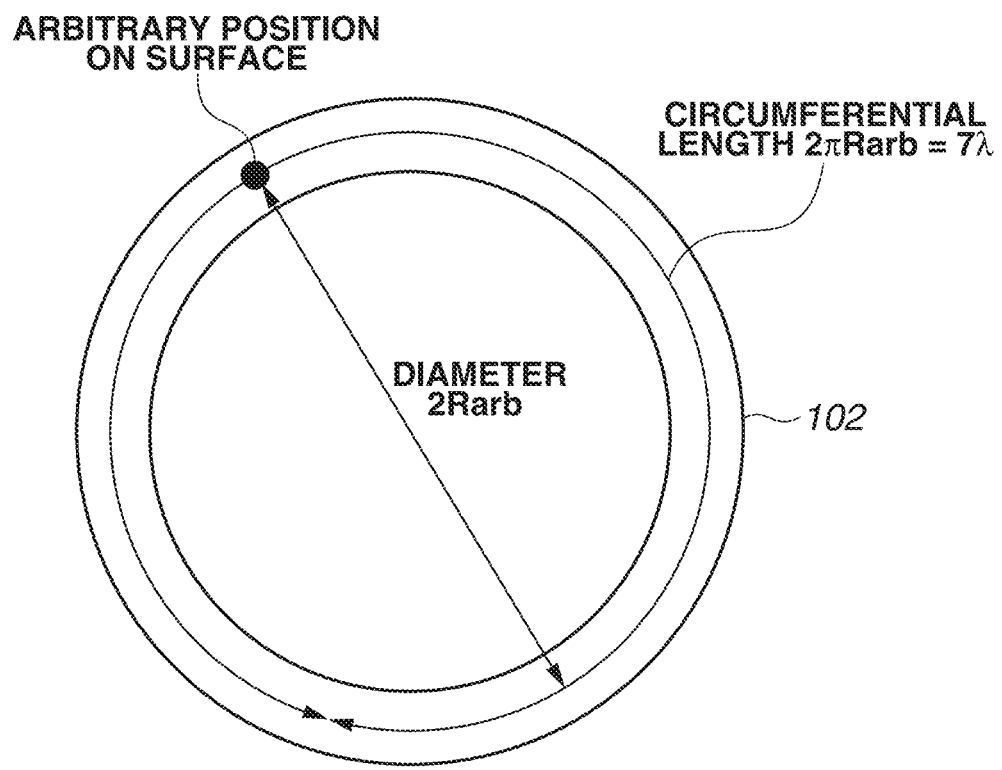
FIG. 3 is a schematic view illustrating a relationship between the circumferential length and the wavelength of a vibration wave in an annular piezoelectric element which is used in the vibration wave motor and a vibrator according to the exemplary embodiment. For ease of description, various electrodes are omitted from illustration.

FIG. 3 is a schematic view illustrating a relationship between the circumferential length and the wavelength of a vibration wave in the annular piezoelectric element 102, which is used in the vibration wave motor according to the present exemplary embodiment. A circular ring illustrated in FIG. 3 is substantially the same as the shape of the piece of piezoelectric ceramics 1021. When an arbitrary position is specified on the surface of the circular ring, and the diameter of a circle having the same center as that of the annular shape of the piezoelectric element 102 and passing through the specified arbitrary position is denoted by 2Rarb (the unit being mm), the circumferential length of the circle becomes 2πRarb. This circumferential length 2πRarb is assumed to be, for example, 7λ.

Figure 4A:
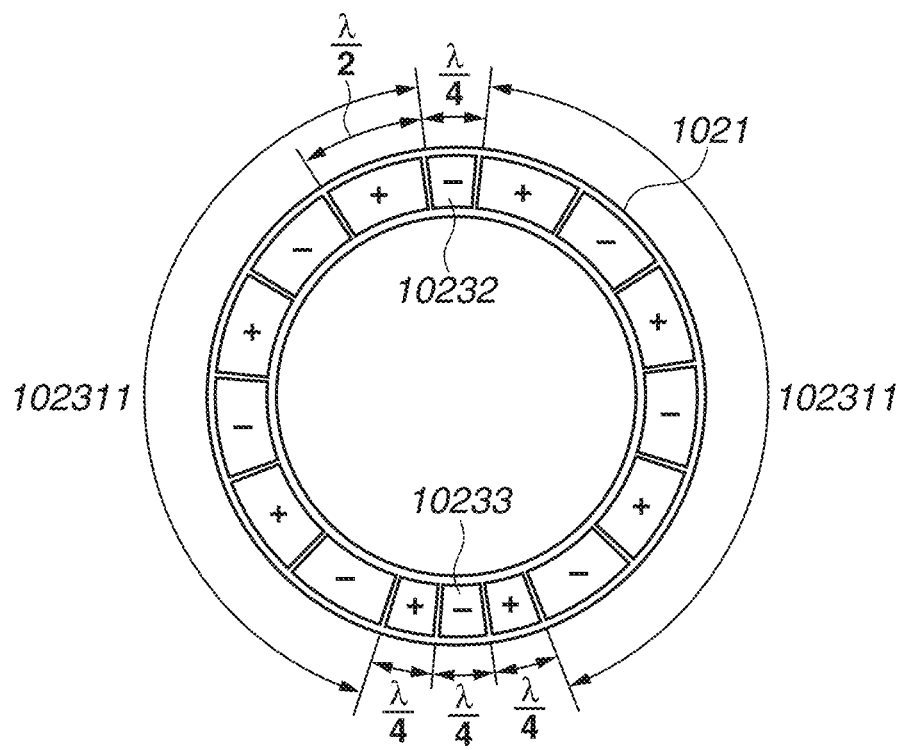
FIGS. 4A and 4B are schematic views illustrating an annular piezoelectric element which is used in the vibration wave motor according to the exemplary embodiment. For ease of description, tether electrodes are omitted from illustration.
Figure 4B:
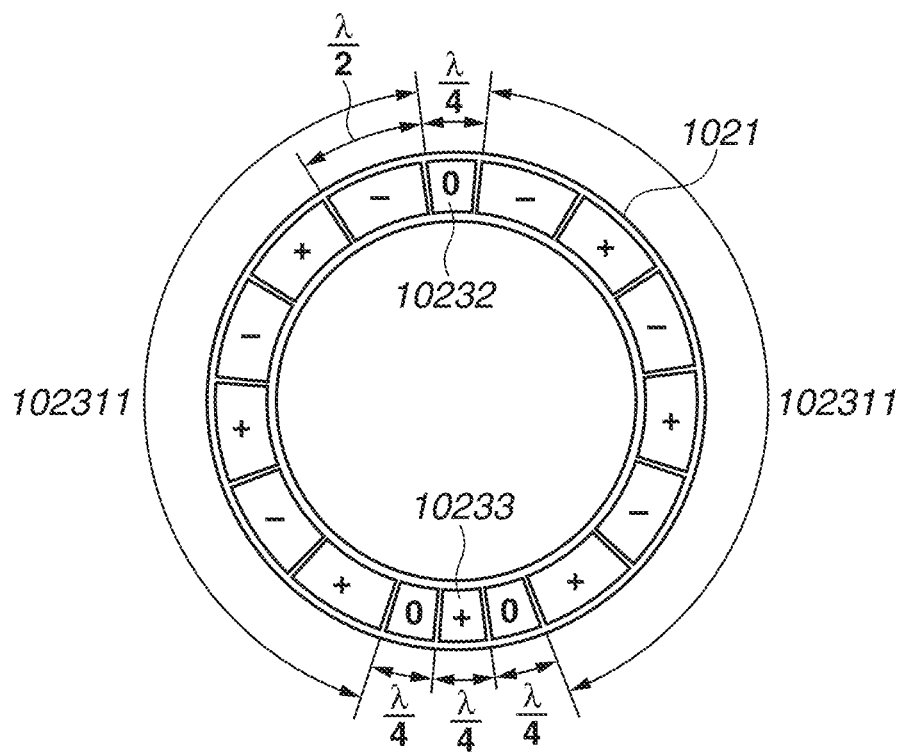

FIGS. 4A and 4B are schematic views illustrating the arrangement of the polarization electrodes 102311 and the polarities of the piezoelectric ceramics 1021 in the piezoelectric element 102, thus being views of the annular piezoelectric element 102 as viewed from the side on which a plurality of electrodes is provided. However, in FIGS. 4A and 4B, for ease of description, the tether electrodes 102312 are omitted from illustration. Furthermore, combinations of the polarities illustrated in FIGS. 4A and 4B are merely examples, and are not intended to limit all embodiments.

A region of the piezoelectric ceramics 1021 which is in contact with the drive phase electrodes 10231 has residual polarization in a direction approximately perpendicular to the drive phase electrodes 10231. The area having residual polarization can be a part or the whole of an area of the piece of piezoelectric ceramics 1021 sandwiched between the polarization electrodes 102311 and the common electrode 1022. In terms of increasing generated force during driving of the vibration wave motor, in some embodiments the whole of the area sandwiched between the polarization electrodes 102311 and the common electrode 1022 has residual polarization. In the present description, the area having residual polarization is referred to as a "polarization portion". The term "residual polarization" refers to polarization remaining in the piece of piezoelectric ceramics 1021 when no voltage is applied to the piece of piezoelectric ceramics 1021. Since performing poling processing on the piece of piezoelectric ceramics 1021 causes the direction of spontaneous polarization to be aligned with the direction of voltage application, the piece of piezoelectric ceramics 1021 acquires residual polarization. Whether the piece of piezoelectric ceramics 1021 has residual polarization can be specified by applying an electric field between the electrodes that sandwich the piezoelectric element 102 and measuring the applied electric field E and the polarization amount P (a P-E hysteresis curve).

Each drive phase electrode 10231 includes six polarization electrodes 102311, and, accordingly, there are also six portions of the piece of piezoelectric ceramics 1021 which are in contact with the polarization electrodes 102311—in other words, six polarization portions. Six polarization portions and polarization electrodes 102311 are arranged along the circumference while sandwiching the respective non-polarization portions, as illustrated in FIGS. 4A and 4B. The polarities of the polarization portions are alternately reversed as viewed in the order of arrangement along the circumference. In FIGS. 4A and 4B, the symbols "+" and "−" written in the insides of the polarization electrodes 102311 indicate the respective directions of residual polarization—in other words, polarities. In the present specification, since the symbol "+" is written in an electrode portion to which a positive voltage was applied during poling processing in the manufacturing process of the piezoelectric element 102, when the piezoelectric constant d33 is measured only at the "+" electrode portion, a negative value is detected. Similarly, at the "−" electrode portion, a positive piezoelectric constant d33 is detected. On the other hand, in FIG. 4B, in only electrode portions with the symbol "0" indicated thereon or non-polarization portions with no electrodes provided thereon, only zero or a very small value, for example, 5 pC/N or less, is detected as the piezoelectric constant d33 at room temperature. In the piezoelectric element 102 illustrated in FIGS. 4A and 4B as an example, the piece of piezoelectric ceramics 1021 has regions having a residual polarization facing downward and regions having a residual polarization facing upward with respect to the drawing sheet. The method of checking that the polarities of residual polarization vary depending on the regions includes, for example, a method of making a determination based on the positive or negative of a value detected by measuring a piezoelectric constant and a method of confirming that shift directions from the origin of a coercive electric field in the P-E hysteresis curve are opposite.

In some embodiments the sizes of the respective polarization portions are substantially equal. Moreover, in some embodiments the respective polarization portions (respective polarization electrodes 102311) have a difference of less than 2% in terms of the projected area. As an example of such a configuration, when the length of one of the arcs obtained by dividing the circumference of an annular piezoelectric element equally into seven parts is denoted by λ, the length in the circumferential direction of each of two drive phase electrodes is set to 3λ. Then, the two drive phase electrodes are separated from each other in the circumferential direction by two interval portions having lengths of λ/4 and 3λ/4 in the circumferential direction, and the above-mentioned non-drive phase electrodes and the above-mentioned detection phase electrode are provided at the two interval portions.

<Characteristics, Materials, and Forming Methods of Electrodes>

Each of the polarization electrodes 102311, the non-drive phase electrodes 10232, the detection phase electrode 10233, and the tether electrodes 102312 is composed of a layered or membranal electrical conductor having a resistance value of less than 10Ω, and, in some embodiments, less than 1Ω. The resistance value of an electrode can be evaluated by measurement using, for example, a multimeter (electrical tester). The thickness of each electrode is about 5 nanometers (nm) to 20 micrometers (μm). The material thereof is not specifically limited, but can be a material that is ordinarily used in piezoelectric elements.

The material of each electrode includes, for example, metals, such as titanium (Ti), platinum (Pt), tantalum (Ta), iridium (Ir), strontium (Sr), indium (In), tin (Sn), gold (Au), aluminum (Al), iron (Fe), chromium (Cr), nickel (Ni), palladium (Pd), silver (Ag), and copper (Cu), and compounds thereof. Each of the above-mentioned electrodes can be an electrode composed of one type of these materials or an electrode obtained by stacking two or more types of these materials in layers. Moreover, the electrodes arranged in the piezoelectric element can be made from the respective different materials. Among these, as electrodes used in the present exemplary embodiment, for example, an Ag paste, a baking electrode of Ag, and a sputtering electrode of Au/Ti, which may be favorable in view of having a small resistance value.

<Configuration of the Vibration Plate>

The second surface of the above-mentioned annular vibration plate 101 has a plurality of groove portions extending radially from a center of the vibration plate, and at least one of the plurality of grooves is different in depth. Further, it may be preferable that the second surface of the above-mentioned annular vibration plate 101 has groove portions extending radially at X places, and, when center depths of the groove portions at X places are sequentially denoted by D1 to DX in a circumferential direction, D1 to DX vary along a curve obtained by superposing one or more sine waves.

<Numbers of Protruding Portions and Groove Portions>

As illustrated in FIG. 2, the second surface of the vibration plate 101, which is in contact with the driven body 2, has a plurality of groove portions 1012 extending radially and having a cross-sectional U-shape. The term "cross-sectional U-shape" refers to a cross-sectional shape having both wall surfaces which are substantially vertical and a bottom surface which is substantially horizontal with respect to the second surface of the vibration plate. However, the cross-sectional U-shape is not limited to what is called a U-shape in which the bottom surface and each wall surface are connected to each other in a round and smooth manner. The cross-sectional U-shape broadly includes shapes resembling what is called a U-shape and able to be deemed as a "cross-sectional U-shape", such as what is called a rectangular shape in which the bottom surface and each wall surface are connected to each other at right angles, a shape intermediate between them, and a shape slightly deformed therefrom.

Figure 5A:
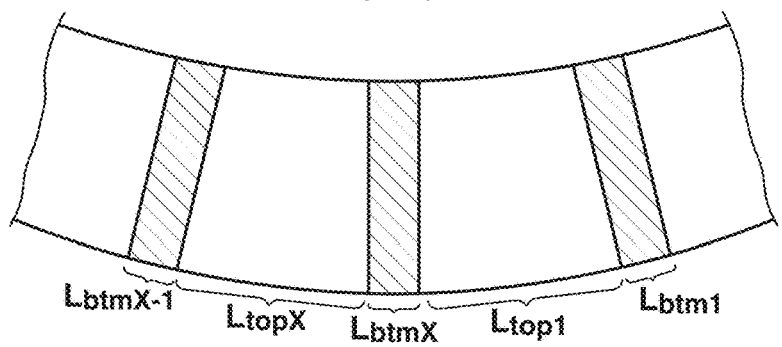
FIGS. 5A, 5B, 5C, and 5D are schematic views illustrating the method of measuring the lengths in the circumferential direction at the outer diameter side of a protruding portion and a groove portion of an annular vibration plate which is used in the vibration wave motor according to the exemplary embodiment.
Figure 5B:
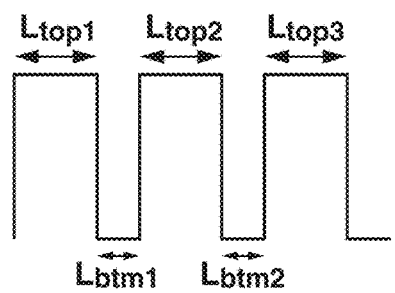
Figure 5C:
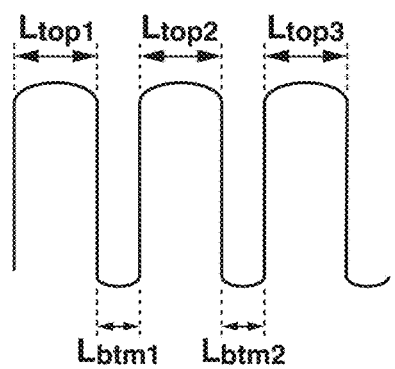
Figure 5D:
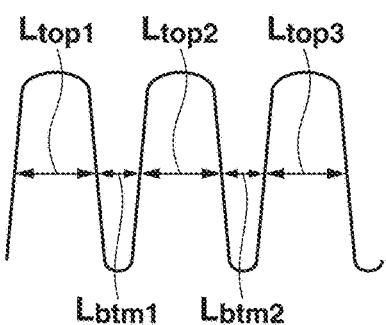

FIG. 5A is a schematic partial plan view of the vibration plate 101 as viewed from the side of the surface which is in contact with the driven body 2 (the second surface), and FIGS. 5B, 5C, and 5D illustrate examples of a cross-sectional shape of the cross-sectional U-shaped groove portions.

<Protruding Portions>

The second surface of the vibration plate 101 has a plurality of groove portions 1012 provided radially, and, between two adjacent groove portions, a protruding portion 1011 separating those groove portions is provided. Then, since a plurality of groove portions 1012 extending radially are arranged in the circumferential direction, the number of protruding portions 1011 each provided therebetween is the same as that of the groove portions 1012. Since the top surface of the protruding portion 1011 is equivalent to the second surface of the annular vibrator, the top surface also serves as a reference surface for defining the depth of each groove portion 1012, and is able to be deemed as a raised portion with respect to a groove portion 1012 serving as a recessed portion—this may be referred to herein as a "protruding portion".

<Center Depth>

The present exemplary embodiment is characterized in that the center depth of at least one of the groove portions 1012 is different in depth from one or more of the other groove portions 1012. However, in FIG. 2, the groove portions 1012 are illustrated in such a way as to have the same center depth. The term "center depth" as used here refers to the depth at the center position of each groove portion 1012 as viewed from the side of the driven body 2. In other words, the center depth is a depth of each groove portion 1012 measured from the top surface of the protruding portion (the second surface of the vibration plate) at the position corresponding to the center of the groove portion 1012 both in the radial direction and in the circumferential direction. Usually, the bottom surface of the groove portion 1012 is parallel to the second surface of the vibration plate 101 as a whole, and is flat as a whole with respect to the radial direction (the direction in which the groove portion extends). Moreover, with respect to the circumferential direction (the direction in which the groove portions are arranged), the bottom surface of the groove portion 1012 is flat as a whole or is concave with the central portion flat and both side portions (portions near the wall surfaces) raised, and, therefore, the center depth means the depth at the deepest portion of each groove portion 1012. However, since that differs depending on the bottom surface shape of each groove portion 1012, the center position does not necessarily mean the depth at the deepest portion, but may mean, for example, a median value of the depth (in a case where the bottom surface is inclined in one direction). However, in a case where the depth at the center position is a value which is not usually used as a representative value of the depth of the groove portion (for example, a singular point), a depth at another point near the center position and having a value representing the depth of the groove portion 1012 is deemed as the center depth. Furthermore, as long as the measurement position for depth is fixed with respect to all of the groove portions 1012, if the bottom surfaces of the respective groove portions have similar shapes, the meaning of the center depth becomes equivalent with respect to all of the groove portions 1012.

The center depths of the groove portions 1012 at X places are respectively denoted sequentially by D1 to DX (the unit of mm) in the circumferential direction of the vibration plate 101. In the present exemplary embodiment, it is preferable that D1 to DX vary along a curve obtained by superposing one or more sine waves.

For example, to prevent or reduce traveling waves of the 4th degree, 5th degree, 6th degree, and 8th degree (wavenumbers along the circular ring being 4, 5, 6, and 8) serving as unnecessary traveling waves with respect to seven traveling waves, as aimed at by the present exemplary embodiment, D1 to DX can be configured to vary along a curve obtained by superposing one or more and four or less sine waves. The general expression of the curve obtained by superposing such sine waves is expressed by the following mathematical formula (1).

$$D = D_{ave} + Am_4 \times \sin(4 \times 2 \times \omega + \theta_4) + Am_5 \times \sin(5 \times 2 \times \omega + \theta_5) + Am_6 \times \sin(6 \times 2 \times \omega + \theta_6) + Am_8 \times \sin(8 \times 2 \times \omega + \theta_8) \quad (1)$$

In mathematical formula (1), $\omega$ is an angle indicating the center line position of the groove extending radially in the annular vibration plate 101. $\theta$ is an angle indicating a phase difference, which is determined as appropriate in such a way as to satisfy a condition described below in the exemplary embodiment. D (the unit being mm) indicates an ideal groove depth at the center position of an arbitrary groove of the annular vibration plate 101, and D1 to DX are assumed to be D±0.1 mm. Moreover, the magnitude relationship of D1 to DX corresponds to D calculated by mathematical formula (1). $D_{ave}$ (the unit being mm) is a standard depth of the groove portion 1012, which is separately set as an average value of D1 to DX.

Am (the unit being mm) is a real number serving as the amplitude of each sine wave for superposition in a curve representing the variation of the center depth of the groove portion, and its suffix indicates the degree (wavenumber) of an unnecessary traveling wave, which is intended to be reduced. At least one of $Am_4$, $Am_5$, $Am_6$, and $Am_8$ takes a value other than "0". The number of sine waves having amplitudes other than "0" is the number of sine waves to be superposed. The number of sine waves to be superposed is not specifically limited in an upper limit as long as it is one or more, but, even when five or more sine waves are superposed, the effect of reducing unnecessary traveling waves may be not be much improved, so that the efficiency of motor driving may be reduced. Therefore, in some embodiments the number of sine waves to be superposed is one or more to four or less. In some embodiments, the number of sine waves to be superposed is two or more to four or less.

Figure 6D:
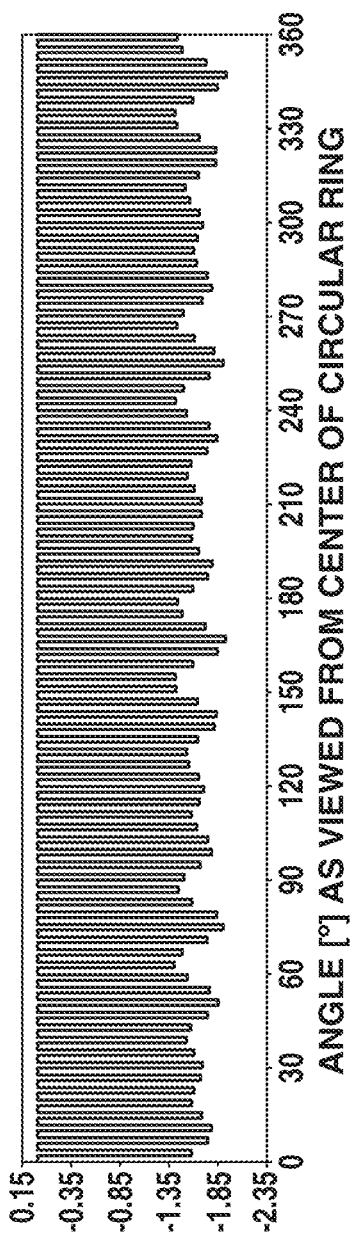
Figure 6E:
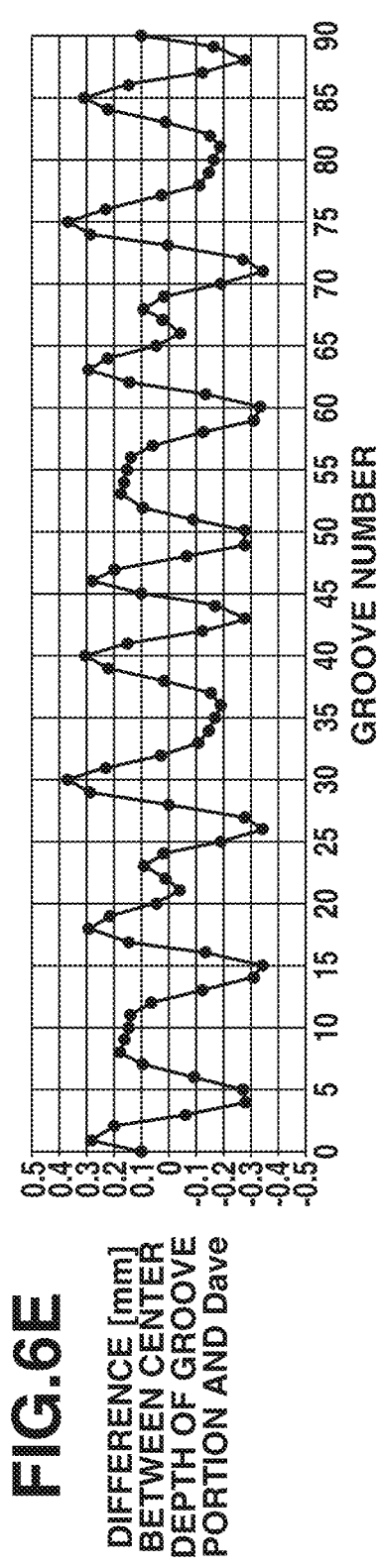

FIGS. 6A, 6B, 6C, 6D, 6E, and 6F are schematic views illustrating manners of variation in the center depth of groove portions of the vibration plate in the vibration wave motor according to the present exemplary embodiment. FIGS. 6A, 6C, and 6E illustrate examples indicating differences between the center depths of the respective groove portions and the standard depth $D_{ave}$ on the assumption of "X=90". The horizontal axis of the plotted graph indicates the orders of 90 groove portions (hereinafter referred to as "groove numbers"). The zero-th order does not intrinsically exist, but is used for the sake of convenience to indicate the depth of the 90th groove portion twice on the plotted graph. Each of the plotted lines of depths of the respective groove portions illustrated in FIGS. 6A and 6C is taken along a curve obtained by superposing two sine waves. Moreover, the plotted line of depths of the respective groove portions illustrated in FIG. 6E is taken along a curve obtained by superposing four sine waves. FIGS. 7A, 7B, 7C, and 7D illustrate groove depths for preventing or reducing traveling waves of the 4th degree, 5th degree, 6th degree, and 8th degree, respectively. When these sine waves are superposed, the curve illustrated in FIG. 6E is obtained.

Figure 6F:
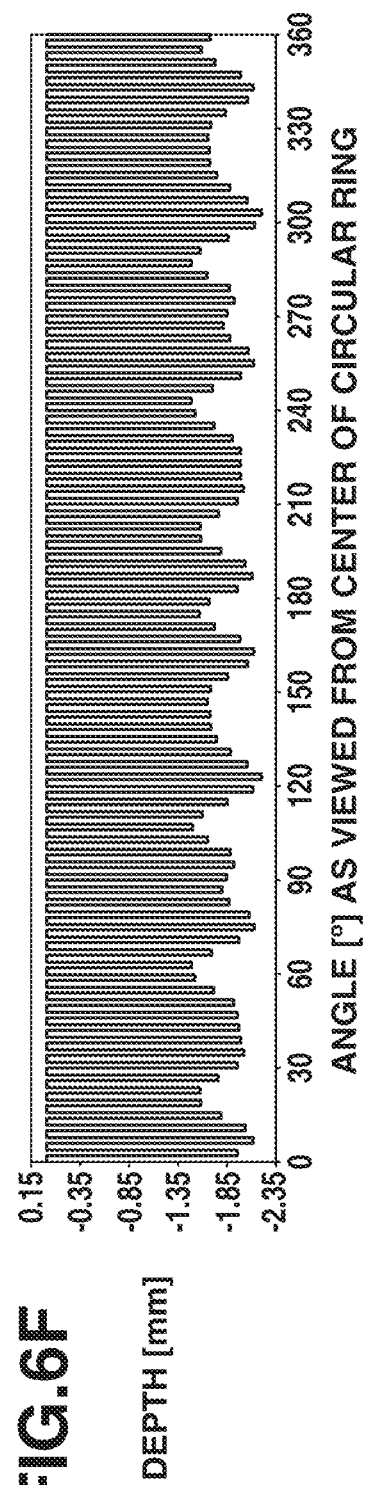

FIG. 6B is a schematic view illustrating, as a plotted graph, a relationship in height and depth between protruding portions and groove portions in a case where the center depths of the respective groove portions illustrated in FIG. 6A are applied to the vibration plate 101 with the standard depth set to "$D_{ave}$=1.85 mm". FIG. 6F is a schematic view illustrating, as a plotted graph, a relationship in height and depth between protruding portions and groove portions in a case where the center depths of the respective groove portions illustrated in FIG. 6E are applied to the vibration plate 101 with the standard depth set to "$D_{ave}$=1.85 mm". Moreover, FIG. 6D is a schematic view illustrating, as a plotted graph, a relationship in height and depth between protruding portions and groove portions in a case where the center depths of the respective groove portions illustrated in FIG. 6C are applied to the vibration plate 101 with the standard depth set to "$D_{ave}$=1.65 mm". In these examples, the heights of the respective protruding portions with the first surface of the vibration plate 101 set as the point of origin are equal. The horizontal axis of the plotted graph indicates angles at which the positions (extending directions) of 90 groove portions are viewed from the center of the circular ring. While values on the horizontal axis are relative values, in FIG. 6B, the end portion of the 89th groove in FIG. 6A is set as the point of origin. Moreover, in FIG. 6D, the end portion of the 89th groove in FIG. 6C is set as the point of origin, and, in FIG. 6F, the end portion of the 89th groove in FIG. 6E is set as the point of origin.

With the groove depths set as illustrated in FIGS. 6A to 6F, with respect to the 7th degree traveling wave, the occurrence of the selected unnecessary traveling waves (the 4th degree, 5th degree, 6th degree, and 8th degree) is significantly reduced or prevented. For example, focusing on only the 4th degree unnecessary traveling wave, as also indicated in the second term in mathematical formula (1), the center depths of the groove portions include local maximum portions (deep portions) at eight places and local minimum portions (shallow portions) at eight places at equal intervals (angles of $\pi/4$) with respect to the circumference. Since the positions of the antinodes of the respective standing waves occurring at two drive phase electrode portions also deviate from each other by every angle of $\pi/4$, one standing wave oscillates at places with low elastic modulus, so that the resonant frequency shifts to the low-frequency side. The other standing wave oscillates at places with high elastic modulus, so that the resonant frequency shifts to the high-frequency side. Since the resonant frequencies of the respective standing waves separate from each other, as a result, the 4th degree traveling wave (unnecessary traveling wave) is prevented from occurring. With respect to unnecessary traveling waves of the other degrees, the same mechanism for prevention or reduction is also employed.

As the method of checking that at least one of the center depths of the groove portions 1012 at X places in the vibration plate 101 of the vibration wave motor is different in depth, and the center depth of the groove portion 1012 varies along a curve obtained by superposing one or more sine waves, the following method can be shown as an example. First, the coordinates and depths of the central portions of the respective grooves with respect to the circumferential length at the outer diameter side of the vibration plate are actually measured. When the coordinates of the groove portions are taken on the horizontal axis and the actually measured depths are taken on the vertical axis, values are interpolated between plots, so that a curve on which groove depths are present with respect to all of the coordinates is assumed. This curve is Fourier-transformed, so that the presence of sine waves and the number thereof are detected.

<Relationship Between Detection Phase Electrode and Center Depth of Groove>

The center depth of a groove portion closest to the detection phase electrode 10233 out of the groove portions 1012 at X places is denoted by Dsen. Here, "sen" is a natural number, and is 1 or more to X or less. The groove portion closest to the detection phase electrode 10233 is determined with the center of the detection phase electrode 10233 used as a reference point. The center depths of two groove portions adjacent to the groove portion closest to the detection phase electrode 10233 are denoted by Dsen−1 and Dsen+1. At this time, in some embodiments, "|Dsen+1−Dsen−1|/Dsen" is 5% or less. And in some embodiments, |Dsen+1−Dsen−1|/Dsen≤2%. The relationship between the center depths of three groove portions is set within the above-mentioned range, so that the center depths of groove portions adjacent to the detection phase electrode 10233 on both sides thereof become close to each other. As a result, the amplitude of the vibrator 1 near the detection phase electrode 10233 during driving of the vibration wave motor becomes nearly equal regardless of clockwise driving or counterclockwise driving, so that control of driving of the vibration wave motor by a drive circuit is facilitated.

<Material of Vibration Plate>

The vibration plate 101 is intended to form traveling waves of bending vibration in cooperation with the piezoelectric element 102 and transmit vibration to the driven body 2, so, in some embodiments, the vibration plate 101 is an elastic body. Moreover, from the viewpoint of the nature and workability of an elastic body, in some embodiments the vibration plate 101 is made from metal. The metal usable to make the vibration plate 101 includes, for example, aluminum, brass, Fe-Ni36% alloy, and stainless steel. Out of these, a stainless steel can be used to attain a high rotation speed in combination with a piece of piezoelectric ceramics 1021, the Young's modulus of which is 100 GPa or more to 135 GPa or less at room temperature, which is used in the present exemplary embodiment. The stainless steel as used here refers to an alloy containing 50% or more by mass of steel and 10.5% or more by mass of chrome. Out of stainless steels, a martensitic stainless steel may be favorable, and SUS420J2 may be most favorable as the material of the vibration plate 101 in some embodiments.

<Shape of Vibration Damping Member>

Figure 8A:
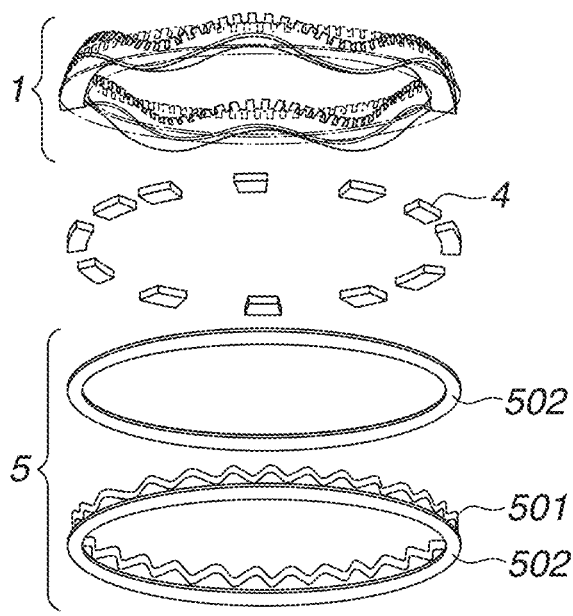
FIGS. 8A, 8B, and 8C are schematic exploded perspective views illustrating the vibration wave motor according to the exemplary embodiment.
Figure 8B:
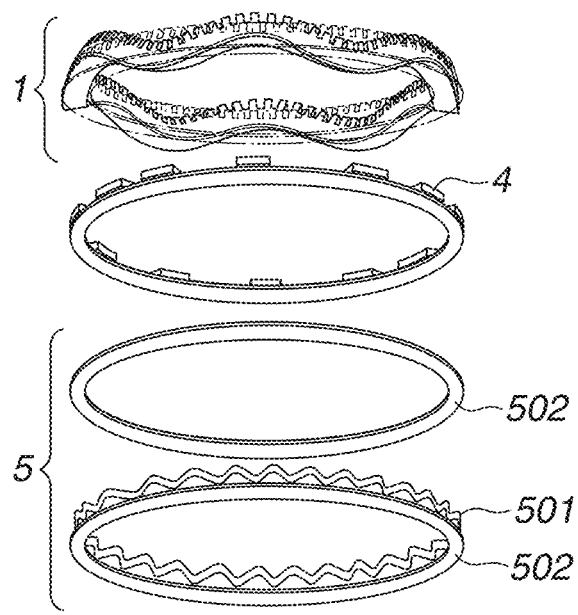
Figure 8C:
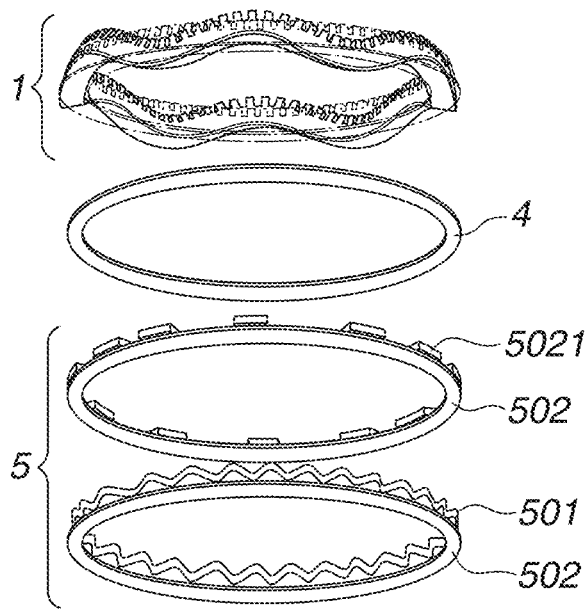

FIGS. 8A, 8B, and 8C are perspective views schematically illustrating behaviors of the respective vibration wave motors at a given time during driving. FIGS. 8A, 8B, and 8C illustrate exemplary embodiments which differ in the shapes of the vibration damping member 4 and the pressure member 5, according to each of which advantageous effects can be attained. Moreover, FIGS. 8A, 8B, and 8C are views of the vibration wave motors as viewed from an oblique direction, in which, actually, the vibrator, the driven body, and the vibration damping member are brought into pressed contact with each other by the pressure member but are illustrated as being separated from each other in the central axis direction of the circular ring. However, the electrodes of the piezoelectric element are omitted from illustration.

In order for the vibration plate to prevent or reduce the 4th degree, 5th degree, 6th degree, and 8th degree traveling waves, other than the 7th degree traveling wave, the groove depths vary along a curve obtained by superposing the 4th degree, 5th degree, 6th degree, and 8th degree sine waves.

The vibrator 1 illustrated in each of FIGS. 8A to 8C represents the deformed state thereof obtained when the amplitude of the 6th degree unnecessary standing wave, which occurs when the vibration wave motor is driven, reaches the maximum, and the vibration damping member 4 is provided in such a way as to restrain the positions of the antinodes (antinode portions) of the 6th degree unnecessary standing wave. However, the deformation amount of the vibrator 1 is illustrated with the deformation magnification enlarged. As illustrated in FIGS. 8A to 8C, the vibration damping member 4 is provided at positions equivalent to some or all of the antinode portions of the standing wave, so that application of pressure by the pressure member 5 becomes uneven and locally large at the position of the vibration damping member 4.

To check the positions of the antinode portions of a given number-th degree standing wave which occurs when the vibration wave motor is driven, first, in the state in which only a vibrator is present, an input signal at a small voltage (for example, an alternating voltage of 1 V to 10 V) is input to the drive phase electrodes of the vibrator. Then, with use of, for example, a laser Doppler vibrometer, the vibration amplitudes of all of the groove portions or protruding portions are measured while the frequency of the input signal is varied. A point where the vibration amplitude reaches a local minimum is called a node, and the position thereof is called a node portion, and a point where the vibration amplitude reaches a local maximum is called an antinode, and the position thereof is called an antinode portion.

In a case where unnecessary standing waves of the same degree appear in different positions at a plurality of frequencies, the vibration damping member 4 can be provided in such a way as to restrain the antinode portions of the respective standing waves. Alternatively, an unnecessary standing wave having the larger vibration amplitude can be selected and the vibration damping member 4 can be provided in such a way as to restrain the antinode portions of the selected standing wave.

The location at which to provide the vibration damping member can be determined by another method.

The vibration wave motor according to the present exemplary embodiment includes a vibrator, a driven body, a vibration damping member, and a pressure member, and the vibrator includes an annular vibration plate and an annular piezoelectric element, which is provided on a first surface of the vibration plate. The vibration plate is in contact with the driven body at a second surface opposite to the above-mentioned first surface. Moreover, the piezoelectric element includes one annular piece of piezoelectric ceramics, a common electrode provided on a surface of the piece of piezoelectric ceramics facing the vibration plate, and a plurality of electrodes provided on a surface of the piezoelectric ceramics opposite to the surface on which the common electrode is provided.

In some embodiments, the second surface of the annular vibration plate has groove portions extending radially at X places, and, when the center depths of the groove portions at X places are sequentially denoted by D1 to DX in the circumferential direction, D1 to DX vary along a curve obtained by superposing one or more sine waves. Also, in some embodiments the application of pressure is made locally large in some or all of the antinodes of the sine waves.

FIG. 7C illustrates groove depths which are set to prevent or reduce the 6th degree traveling wave, in which the groove depths vary along the sine wave curve expressed by mathematical formula (1).

In the 6th degree unnecessary standing wave, which has antinodes at portions in which the groove depth reaches a local maximum, the vibration amplitude is likely to become large. Therefore, the vibration damping member is provided at antinode portions of the 6th degree unnecessary standing wave, in other words, at antinode portions of the sine wave illustrated in FIG. 7C, so that the antinode portions of the unnecessary standing wave can be restrained to make the vibration amplitude smaller. This prevents or reduces the occurrence of abnormal noise and power reduction.

As illustrated in FIG. 8B, a configuration in which, in one piece of a vibration damping member, the thickness of the vibration damping member is made large at some or all of the antinode portions of a standing wave occurring when the vibration wave motor is driven, so that application of a pressure that is made locally larger can be employed.

In the vibration wave motor according to the present exemplary embodiment, contact portions between the vibration damping member and the piezoelectric element are separate from each other at a plurality of places. As illustrated in FIG. 8A, contact portions between the vibration damping member and the piezoelectric element are separate from each other at a plurality of places, so that application of pressure can be performed more locally than in the configuration illustrated in FIG. 8B and, thus, unnecessary standing waves can be prevented or reduced more effectively.

While, in the examples illustrated in FIGS. 8B and 8C, the vibration damping member 4 has an annular shape, in a case where a separation structure is employed as illustrated in FIG. 8A, each piece of the vibration damping member 4 is shaped in a sector form.

In the above-described configuration, the application of pressure is made locally large at all of the antinode portions of a standing wave occurring when the vibration wave motor is driven. Even when the application of pressure is made locally large at just some of the antinode portions of a standing wave occurring when the vibration wave motor is driven, a similar advantageous effect can be attained. However, to more effectively prevent or reduce unnecessary standing waves, some embodiments have a configuration in which the application of pressure is made locally large at all of the antinode portions of a standing wave occurring when the vibration wave motor is driven.

<Application of Pressure Being Local>

Here, whether the application of pressure has become locally large at assumed locations is checked by inserting, for example, pressure-sensitive paper or a film-like pressure sensor between the vibrator and the vibration damping member and applying pressure with a pressure member.

<Length in Circumferential Direction of Vibration Damping Member>

In a case where the vibration damping member is configured to have a separated structure, in some embodiments the length in the circumferential direction of each piece of the vibration damping member is as short as possible. To effectively prevent or reduce unnecessary standing waves, in some embodiments, when the wavelength of the N-th degree standing wave occurring when the vibration wave motor is driven is denoted by PN, the length is shorter than PN/4 centering around each antinode portion of the N-th degree standing wave. With this, since the application of pressure becomes more locally large, unnecessary standing waves are more prevented or reduced. Moreover, from the viewpoint of workability, in some embodiments the shortest portion of the length in the circumferential direction of each piece of the vibration damping member is 1 mm or more.

<Thickness and Width of Vibration Damping Member>

In some embodiments the thickness of the vibration damping member is 0.3 mm or more and 2 mm or less.

Since, if the pressure member vibrates, abnormal noise is generated, in some embodiments, to prevent the vibration of the vibrator from being transmitted to the pressure member via the vibration damping member, the thickness of the vibration damping member is 0.3 mm or more. Moreover, if, when the vibration of the vibrator is transmitted to the driven body, the thickness of the vibration damping member is too large, the vibration damping member excessively absorbs a traveling wave of the intended number-th degree (for example, the 7th degree) which is used to drive the vibration wave motor, and thus becomes unlikely to transmit force as a reaction force to the driven body. In some embodiments, the thickness of the vibration damping member is 2 mm or less.

Moreover, in some embodiments the inner diameter of the vibration damping member is larger than the inner diameter of the piezoelectric element, and in some embodiments the outer diameter of the vibration damping member is equal to or smaller than the outer diameter of the piezoelectric element. If the outer diameter of the vibration damping member is larger than that of the piezoelectric element, the outer edge portion of the vibration damping member may disturb the vibration of the piezoelectric element.

While the inner diameter and outer diameter of the vibration damping member have been described above, in some embodiments where the vibration damping member is configured to have a separated structure, the inner diameter is larger than the inner diameter of the piezoelectric element and the outer diameter is smaller than the outer diameter of the piezoelectric element.

<Shape of Pressure Member>

In the vibration wave motor according to the present exemplary embodiment, the pressure member can be configured to have raised portions at places where antinode portions of the standing wave are pressed.

Referring to FIG. 8C, raised portions 5021 are provided on an annular flat plate constituting the pressure member. The raised portions 5021 can be provided by, for example, press working, and the positions thereof are all of the antinode portions of the 6th degree unnecessary standing wave of the vibrator. Since the pressure member has the raised portions 5021 at places where antinode portions of the standing wave are pressed, the application of pressure becomes locally large at some or all of the antinode portions of a standing wave (unnecessary standing wave) occurring when the vibration wave motor is driven. Thus, the antinode portions of the unnecessary standing wave are restrained, so that the vibration amplitude of the unnecessary standing wave can be made small. This prevents or reduces abnormal noise and power reduction in the unnecessary standing wave.

Here, while, in FIG. 8C, one piece of pressure member is provided, a pressure member having a separated configuration as in the vibration damping member illustrated in FIG. 8A can be employed, so that pieces of the pressure member can be provided at some or all of the antinode portions of a standing wave occurring when the vibration wave motor is driven. With such a configuration employed, the application of pressure can be made locally large. Moreover, in some embodiments the raised portions need to have only a structure capable of locally applying pressure, and the raised portions can also be of a triangularly protuberant shape or a spherically protuberant shape.

<Length in Circumferential Direction, Thickness, and Width of Raised Portion of Pressure Member>

In a case where the pressure member is provided with raised portions 5021, in some embodiments the length of each raised portion of the pressure member is as short as possible. To effectively prevent or reduce unnecessary standing waves, in some embodiments, when the wavelength of the N-th degree standing wave occurring when the vibration wave motor is driven is denoted by PN, the length is shorter than PN/4 centering around each antinode portion of the N-th degree standing wave. With this, since the application of pressure becomes more locally large, unnecessary standing waves are further prevented or reduced. Moreover, from the viewpoint of workability, in some embodiments the shortest portion of the length in the circumferential direction of each raised portion 5021 of the pressure member is 1 mm or more.

Moreover, in some embodiments the thickness of the pressure member is 1 mm or more and is 10 mm or less. When the thickness of the pressure member is 1 mm or more, working by, for example, press working becomes easy. If the thickness of the pressure member exceeds 10 mm, the vibration wave motor becomes large in size, and, therefore, becomes unlikely to be applied to, for example, a small-sized optical apparatus.

Moreover, in some embodiments the inner diameter of the pressure member is set almost equal to the inner diameter of the vibration damping member. When the inner diameter of the pressure member is set almost equal to the inner diameter of the vibration damping member, the position adjustment which is performed when the pressure member is provided adjacent to the vibration damping member becomes easy.

Furthermore, in FIGS. 8A to 8C, as examples of the present exemplary embodiment, the method of preventing or reducing the 6th degree unnecessary standing wave has been described. The method of preventing or reducing other number-th degree unnecessary standing waves can be performed in a similar manner, and in some embodiments the application of pressure by the pressure member needs only to be made locally large at some or all of the antinodes of an unnecessary standing wave of any number-th degree intended to be prevented or reduced.

Furthermore, while, in the present exemplary embodiment, a vibration wave motor utilizing the 7th degree bending vibration wave has been described above as an example, the present exemplary embodiment can also be applied to a vibration wave motor utilizing another number-th degree bending vibration wave. For example, in a vibration wave motor utilizing the 6th degree bending vibration wave, unnecessary standing waves of other than the 6th degree can be prevented or reduced. In some embodiments, the application of pressure by the pressure member needs to be made locally large only at some or all of the antinodes of an unnecessary standing wave that is intended to be prevented or reduced. Similarly, the present exemplary embodiment can also be applied to a vibration wave motor utilizing an arbitrary bending vibration wave of, for example, the 8th degree or 11th degree.

<Maintaining Positional Relationship During Driving>

While unnecessary standing waves can be prevented or reduced with the above-described configuration, if the locations in the circumferential direction of three members (i.e., the annular vibration plate, the vibration damping member, and the pressure member) vary during driving, the effect of preventing or reducing unnecessary standing waves may be reduced. Therefore, in the vibration wave motor according to some embodiments, the locations in the circumferential direction of three members (i.e., the annular vibration plate, the vibration damping member, and the pressure member) are fixed relative to each other. For the purpose of fixing, an adhesive can be used to bond the members together or a non-slip member can be inserted between the members. Moreover, the members can be respectively fixed to another component with, for example, an adhesive.

<Piezoelectric Ceramics being Barium Titanate Series Material>

The composition of the piece of piezoelectric ceramics 1021 is not specifically limited as long as the content of lead is less than 1000 ppm (in other words, a lead-free series). For example, a piezoelectric ceramics made from barium titanate, barium calcium titanate, barium calcium zirconate titanate, bismuth sodium titanate, potassium sodium niobate, sodium barium niobate titanate, or bismuth ferrate, or a piezoelectric ceramics containing such a composition as a principal component, can be used in the vibration wave motor and the vibrator 1 in various embodiments.

In some embodiments, the above-mentioned piece of piezoelectric ceramics constituting the vibration wave motor is made from a barium titanate series material.

The barium titanate series material refers to a material having a perovskite structure in main phase and containing titanium and barium. Using the barium titanate series material enables attaining a high piezoelectric constant required to drive the vibration wave motor.

In some embodiments, a barium titanate series material contains, as a principal component, a perovskite-type metal oxide expressed by the following general formula (1):

$$(Ba_{1-x}Ca_x)\alpha(Ti_{1-y}Zr_y)O_3 \qquad (1)$$

where
$0.986 \leq \alpha \leq 1.100$,
$0.02 \leq x \leq 0.30$, and
$0.020 \leq y \leq 0.095$, and
the content of metallic components other than the principal component contained in the piezoelectric ceramics is 1.25 parts by weight or less relative to 100 parts by weight of the above-mentioned metal oxide in terms of metal.

In particular, in some embodiments, manganese (Mn) is contained in the above-mentioned metal oxide and the content of such Mn is 0.02 parts by weight or more and is 0.40 parts by weight or less relative to 100 parts by weight of the above-mentioned metal oxide in terms of metal.

The metal oxide expressed by the above-mentioned general formula (1) indicates that metallic elements situated in the A-site are barium (Ba) and calcium (Ca) and metallic elements situated in the B-site are Ti and zirconium (Zr). However, some parts of Ba and Ca can be situated in the B-site. Similarly, some parts of Ti and Zr can be situated in the A-site.

While the molar ratio of the elements in the B-site to the O element in general formula (1) is 1 to 3, the molar ratio can deviate slightly as long as a perovskite structure is used as a main phase.

The metal oxide having a perovskite structure can be determined from structural analysis using, for example, X-ray diffraction or electron beam diffraction.

"x" indicating the molar ratio of Ca in the A-site in general formula (1) is in the range of $0.02 \leq x \leq 0.30$. If some parts of Ba of perovskite-type barium titanate are substituted by Ca in the above-mentioned range, the phase transition temperature between an orthorhombic system and a tetragonal system shifts to the low temperature side, so that stabilized piezoelectric vibration can be obtained in the drive temperature range of the vibration wave motor and the vibrator 1. However, if "x" is larger than 0.30, the piezoelectric constant of the piezoelectric ceramics may be insufficient, so that the rotational speed of the vibration wave motor may be insufficient. On the other hand, if "x" is smaller than 0.02, dielectric loss (tan δ) may increase. If dielectric loss increases, generation of heat which is generated when the vibration wave motor is driven with a voltage applied to the piezoelectric element 102 increases, so that the motor drive efficiency may decrease.

In general formula (1), "y" indicating the molar ratio of Zr in the B-site is in the range of $0.020 \leq y \leq 0.095$. If "y" is smaller than 0.020, the piezoelectric constant of the piezoelectric ceramics may be insufficient, so that the rotational speed of the vibration wave motor may be insufficient. On the other hand, if "y" is larger than 0.095, the depolarization temperature (Td), which is the piezoelectric ceiling temperature, may be low, such as less than 80° C., so that the piezoelectric property of the piece of piezoelectric ceramics 1021 may be lost at high temperatures.

In the present specification, the depolarization temperature (also referred to as "Td") refers to a given temperature Td (° C.) to which the temperature is increased from room temperature after a sufficient time has elapsed after poling processing is performed and from which the temperature is then decreased to room temperature in such a manner that the piezoelectric constant decreases as compared with the piezoelectric constant obtained before the temperature is increased. In the present specification, a temperature which is increased in such a manner that the piezoelectric constant becomes less than 90% of the piezoelectric constant obtained before the temperature is increased is referred to as "depolarization temperature Td".

Moreover, in some embodiments, "α" indicating the ratio of the molar quantity of Ba and Ca in the A-site to the molar quantity of Ti and Zr in the B-site is in the range of $0.986 \leq \alpha \leq 1.100$. If "α" is smaller than 0.986, abnormal grain growth may be more likely to occur in crystal grains constituting the piezoelectric ceramics 1021, so that the mechanical strength of the piece of piezoelectric ceramics 1021 decreases. On the other hand, if "α" becomes larger than 1.100, the temperature required for grain growth of the piece of piezoelectric ceramics 1021 may be too high, so that sintering cannot be performed in a general baking furnace. Here, "sintering being unable to be performed" refers to the density not reaching a sufficient value or a state in which a large number of pores or defects are present in the piezoelectric ceramics.

The method for measuring the composition of the piece of piezoelectric ceramics 1021 is not specifically limited. Examples of such a method include fluorescent X-ray analysis, inductivity coupled plasma (ICP) optical emission spectrometric analysis, and atomic absorption analysis. Even if any measurement method is used, the ratio by weight and the composition ratio of elements contained in the piece of piezoelectric ceramics 1021 can be calculated.

In some embodiments, the piece of piezoelectric ceramics 1021 has, as a principal component, a perovskite-type metal oxide, and Mn is contained in the metal oxide. In some embodiments, the content of Mn is 0.02 parts by weight or more and is 0.40 parts by weight or less relative to 100 parts by weight of the metal oxide in terms of metal.

When Mn in the above-mentioned range is contained, the insulation property and the mechanical quality factor Qm are improved. Here, the mechanical quality factor Qm is a factor representing elastic loss caused by vibration when the piezoelectric element 102 is evaluated as a vibrator, and the magnitude of the mechanical quality factor is observed as the acuteness of a resonant curve in impedance measurement. In other words, the mechanical quality factor Qm is a constant representing the acuteness of the resonance of the piezoelectric element 102. If the mechanical quality factor Qm is large, the amount of distortion of the piezoelectric element 102 becomes larger in the vicinity of a resonant frequency, so that the piezoelectric element 102 can be effectively vibrated.

The improvement in the insulation property and the mechanical quality factor can be considered to derive from the fact that defect dipoles are introduced by Mn, which differs in valence from Ti and Zr, and an internal electric field is generated. When an internal electric field is present, the reliability of the piezoelectric element 102 can be assured when the piezoelectric element 102 is driven with a voltage applied thereto.

Here, the content of Mn in terms of metal is calculated from contents of metals of Ba, Ca, Ti, Zr, and Mn measured by, for example, fluorescent X-ray analysis (XRF), ICP optical emission spectrometric analysis, or atomic absorption analysis from the piece of piezoelectric ceramics 1021. In other words, the content of Mn in terms of metal represents a value obtained by converting the contents of the metals into elements constituting the metal oxide expressed by general formula (1) in terms of oxide and using the ratio of the weight of Mn to the total weights of the elements being set as "100".

If the content of Mn is smaller than 0.02 parts by weight, the effect of poling processing required for driving the piezoelectric element 102 may be insufficient. On the other hand, if the content of Mn is larger than 0.40 parts by weight, the piezoelectric property may be insufficient or a crystal having a hexagonal crystal structure, which does not contribute to the piezoelectric property, may be developed.

Mn is not limited to metal Mn and, in some embodiments, needs only to be contained in the piezoelectric material as an Mn component, and any form of Mn being contained can be employed. For example, Mn can be included in the B-site as solid solution, or can be included in grain boundaries. Alternatively, an Mn component can be contained in the piece of piezoelectric ceramics 1021 in the form of, for example, metal, ion, oxide, metallic salt, or complex. A more favorable form of Mn being contained is solid solution in the B-site from the viewpoint of insulation property and easy sintering. In a case where solid solution in the B-site is employed, when the ratio of the molar quantity of Ba and Ca in the A-site to the molar quantity of Ti, Zr, and Mn in the B-site is denoted by A2/B2, a favorable range of A2/B2 is $0.993 \leq A2/B2 \leq 0.998$.

Moreover, the piece of piezoelectric ceramics 1021 can contain 0.042 parts by weight or more and 0.850 parts by weight or less of bismuth (Bi) relative to 100 parts by weight of the metal oxide expressed in general formula (1) in terms of metal. The content of Bi relative to the above-mentioned metal oxide can be measured by, for example, ICP optical emission spectrometric analysis. Bi can be present in grain boundaries of the ceramics piezoelectric material or can be present as solid solution in a perovskite-type structure of "$(Ba, Ca)(Ti, Zr)O_3$". When Bi is present in grain boundaries, friction between grains is reduced and the mechanical quality factor increases. On the other hand, when Bi is incorporated into a solid solution, which forms a perovskite structure, the phase transition temperature shifts to the low temperature side, so that the temperature dependence of the piezoelectric constant becomes small and the mechanical quality factor further increases. In some embodiments the position where Bi is incorporated into the solid solution is the A-site, because an electric charge balance with the above-mentioned Mn improves.

The piece of piezoelectric ceramics 1021 can contain a component (hereinafter referred to as an "accessory component") other than the elements included in the above-mentioned general formula (1) and Mn and Bi as long as the characteristics thereof are not varied. In some embodiments, the accessory component is smaller than 1.2 parts by weight in total relative to 100 parts by weight of the metal oxide expressed by general formula (1). If the accessory component exceeds 1.2 parts by weight, the piezoelectric property and the insulating property of the piece of piezoelectric ceramics 1021 may decrease. Moreover, in some embodiments the content of a metallic element other than the above-mentioned Ba, Ca, Ti, Zr, and Mn in the accessory component is 1.0 parts by weight or less in terms of oxide or is 0.9 parts by weight or less in terms of metal relative to 100 parts by weight of the piezoelectric ceramics. In the present exemplary embodiment, the term "metallic element" as used here also includes metalloid elements, such as silicon (Si), germanium (Ge), and antimony (Sb). If the content of a metallic element other than Ba, Ca, Ti, Zr, and Mn exceeds 1.0 parts by weight in terms of oxide or 0.9 parts by weight in terms of metal relative to 100 parts by weight of the piezoelectric ceramics, the piezoelectric property and the insulating property of the piece of piezoelectric ceramics 1021 may significantly decrease.

Here, strontium (Sr) or magnesium (Mg) in such a degree as to be contained as an unavoidable component in commercial materials of Ba and Ca can be included in the piezoelectric material used in the present exemplary embodiment. Likewise, niobium (Nb) in in such a degree as to be contained as an unavoidable component in commercial materials of Ti and hafnium (Hf) in in such a degree as to be contained as an unavoidable component in commercial materials of Zr can be included in the piezoelectric ceramics 1021 in the present exemplary embodiment.

The method for measuring the number of parts by weight of an accessory component is not specifically limited. Examples of the measurement method include fluorescent X-ray analysis (XRF), ICP optical emission spectrometric analysis, and atomic absorption analysis.

<Drive Control System>

Figure 9:
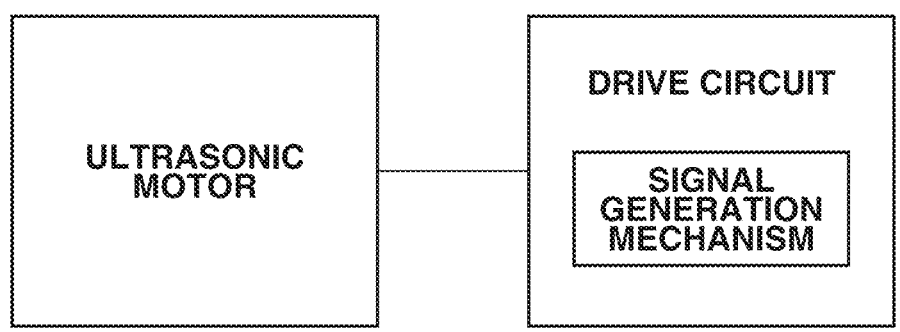
FIG. 9 is a schematic diagram illustrating a drive control system according to an exemplary embodiment.

Next, a drive control system in the present exemplary embodiment is described. FIG. 9 is a schematic view illustrating the drive control system according to the present exemplary embodiment. The drive control system includes at least a vibration wave motor (ultrasonic motor) in the present exemplary embodiment and a drive circuit, which is electrically connected to the vibration wave motor. The drive circuit includes therein a signal generation mechanism that generates an electrical signal to cause the vibration wave motor in the present exemplary embodiment to generate the 7th degree bending vibration wave and to be rotationally driven.

The drive circuit concurrently applies alternating voltages having the same frequency and a temporal phase difference of $\pi/2$ to the respective drive phase electrodes 10231 (A-phase and B-phase) of the vibration wave motor. As a result, standing waves generated in the A-phase and the B-phase are combined, so that the 7th degree bending vibration wave (wavelength $\lambda$), which travels in the circumferential direction, is generated on the second surface of the vibration plate 101.

At this time, since points on the protruding portions 1011 at X places of the vibration plate 101 perform an elliptic motion, the driven body 2 rotates by receiving a frictional force in the circumferential direction from the vibration plate 101. When the 7th degree bending vibration wave is generated, the detection phase electrode 10233 generates a detection signal corresponding to the amplitude of the vibration of the piece of piezoelectric ceramics 1021 in a portion which is in contact with the detection phase electrode 10233, and outputs the generated detection signal to the drive circuit via wiring lines. The drive circuit compares phases of the detection signal and the drive signal input to the drive phase electrodes 10231, thus detecting a deviation from the resonant condition. This information is used to re-determine the frequency of the drive signal to be input to the drive phase electrodes 10231, thus enabling feedback control of the vibration wave motor.

<Optical Apparatus>

Next, an optical apparatus in the present exemplary embodiment is described. The optical apparatus in the present exemplary embodiment is characterized by including a drive control system, which uses a vibration wave motor according to the present exemplary embodiment, and an optical member supported by the vibration wave motor.

Figure 10A:
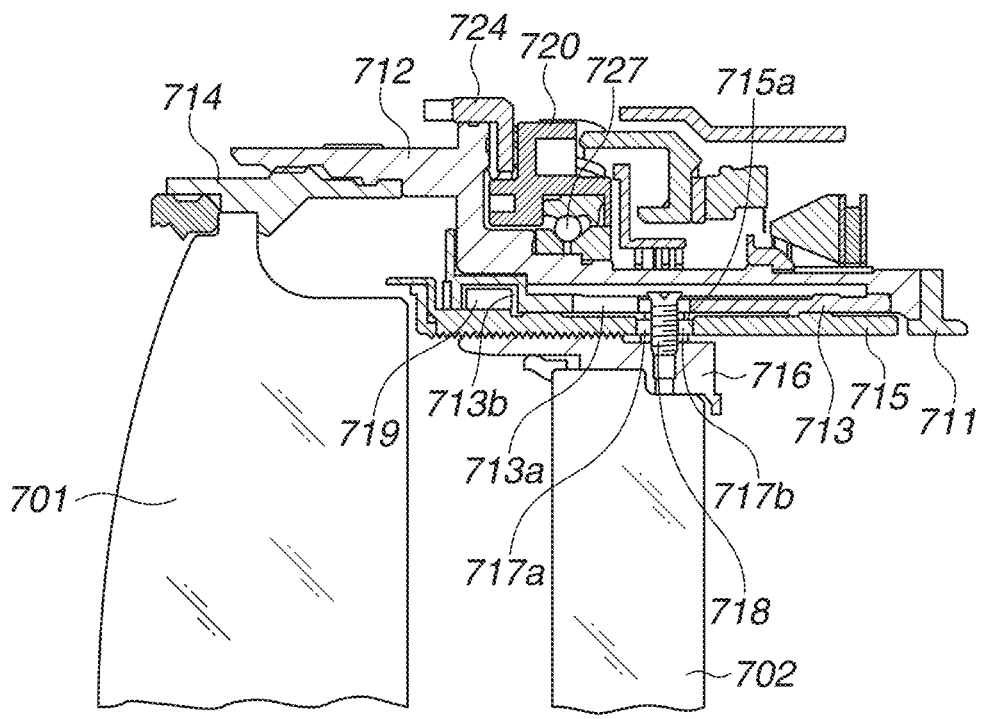
FIGS. 10A and 10B are schematic views illustrating an optical apparatus according to an exemplary embodiment.
Figure 10B:
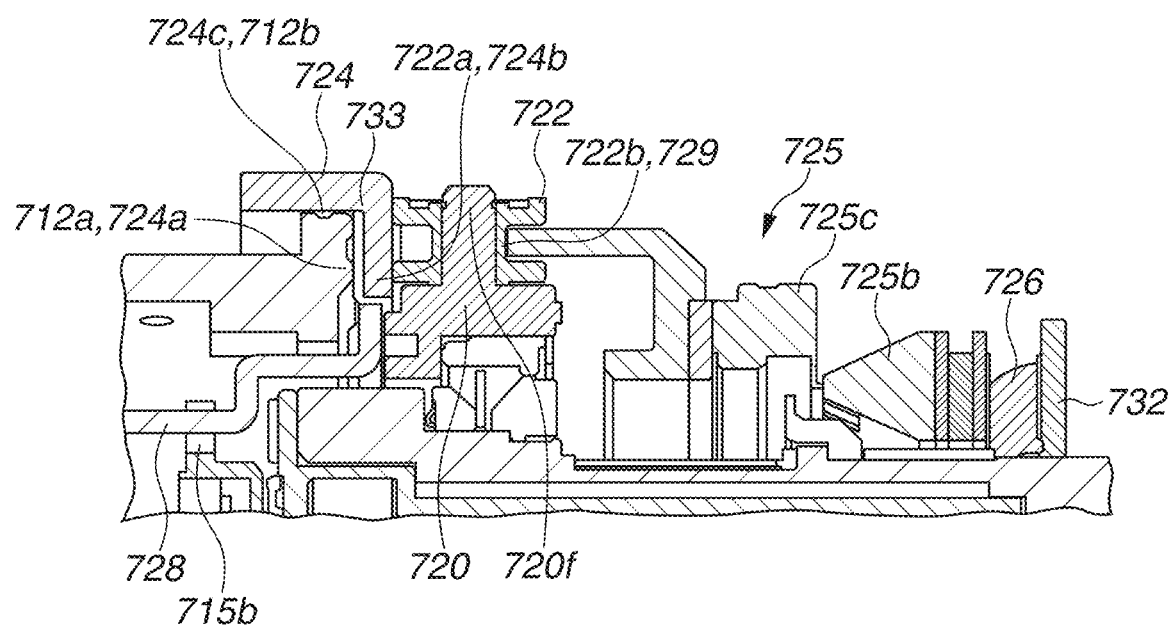
Figure 11:
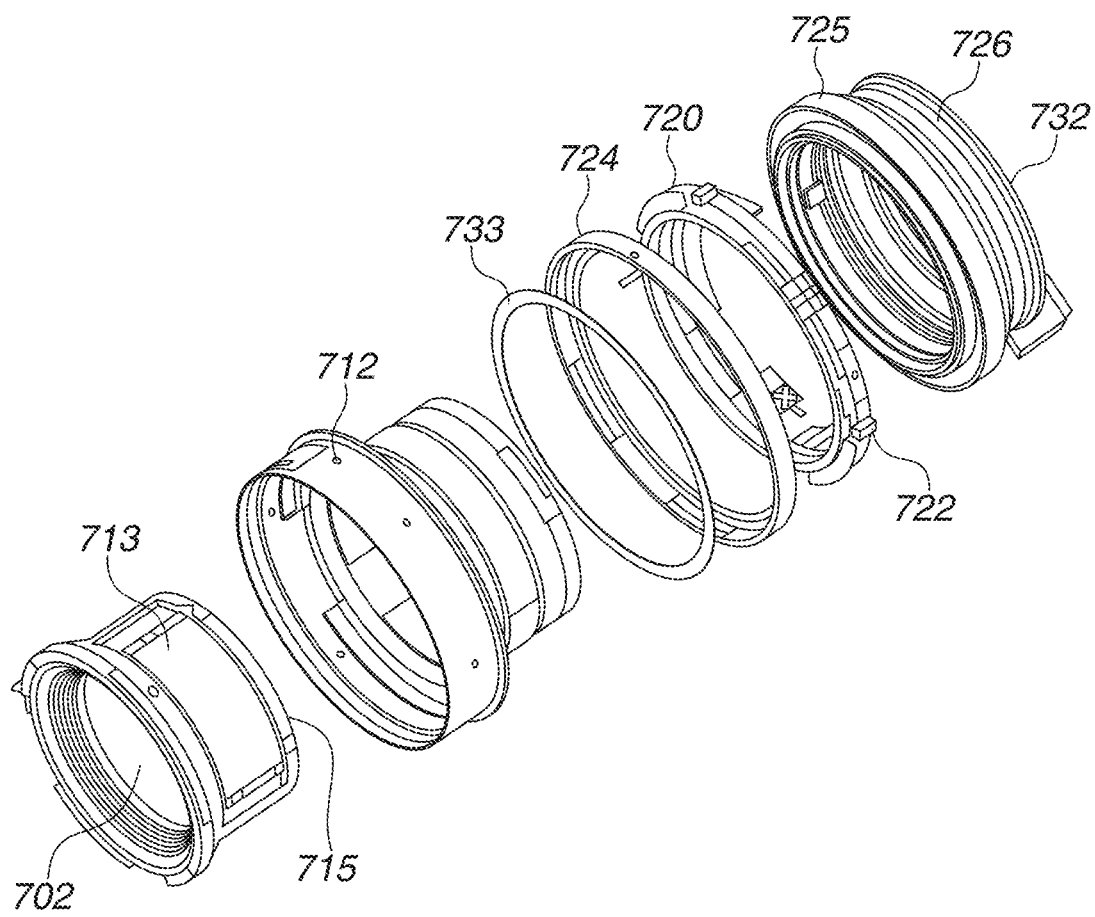
FIG. 11 is a schematic view illustrating the optical apparatus according to the exemplary embodiment.

FIGS. 10A and 10B are principal sectional views of an interchangeable lens barrel of a single-lens reflex camera serving as an example of an optical apparatus in the present exemplary embodiment. Moreover, FIG. 11 is an exploded perspective view of the interchangeable lens barrel of the single-lens reflex camera serving as an example of an optical apparatus in the present exemplary embodiment. A fixed tube 712, a rectilinear guide tube 713, and a front lens group tube 714, which holds a front lens group 701, are fixed to an attachment and detachment mount 711 for the camera. These are fixing members for the interchangeable lens barrel.

A rectilinear guide slot 713a in the optical axis direction for a focus lens 702 is formed in the rectilinear guide tube 713. Cam rollers 717a and 717b protruding outward in the radial direction are fixed to a rear lens group tube 716, which holds the focus lens 702, via a shaft screw 718, and the cam roller 717a is fitted in the rectilinear guide slot 713a.

A cam ring 715 is fitted on the inner circumference of the rectilinear guide tube 713 in such way as to be freely rotatable. The rectilinear guide tube 713 and the cam ring 715 are restricted from relative movement in the optical axis direction by a roller 719 fixed to the cam ring 715 being fitted into a circumferential groove 713b of the rectilinear guide tube 713. A cam groove 715a for the focus lens 702 is formed in the cam ring 715, and the above-mentioned cam roller 717b is concurrently fitted in the cam groove 715a.

A rotation transmission ring 720, which is held in such a way as to be rotatable in a fixed position relative to the fixed tube 712 via a ball race 727, is arranged on the outer circumference side of the fixed tube 712. In the rotation transmission ring 720, rollers 722 are rotatably held by shafts 720f, which extend radially from the rotation transmission ring 720, and a large diameter portion 722a of each roller 722 is in contact with a mount-side end surface 724b of a manual focus ring 724. Moreover, a small diameter portion 722b of each roller 722 is in contact with a junction member 729. Six rollers 722 are arranged at regular intervals on the outer circumference of the rotation transmission ring 720, and each roller is configured in the above-described relationship.

A low-friction sheet (washer member) 733 is arranged at the inner diameter portion of the manual focus ring 724, and the low-friction sheet 733 is sandwiched between a mount-side end surface 712a of the fixed tube 712 and a front-side end surface 724a of the manual focus ring 724. Moreover, the outer diameter surface of the low-friction sheet 733 is ring-shaped and is radially fitted on the inner diameter 724c of the manual focus ring 724, and the inner diameter 724c of the manual focus ring 724 is radially fitted on the outer diameter portion 712b of the fixed tube 712. The low-friction sheet 733 functions to reduce friction in a rotation ring mechanism in which the manual focus ring 724 is configured to rotate around the optical axis relative to the fixed tube 712.

Furthermore, the large diameter portion 722a of each roller 722 and the mount-side end surface 724b of the manual focus ring 724 are in contact with each other in a state in which a pressing force is applied due to a force of a wave washer 726 pressing the vibration wave motor 725 toward the front of the lens. Moreover, likewise, the small diameter portion 722b of each roller 722 and the junction member 729 are in contact with each other in a state in which an appropriate pressing force is applied due to a force of the wave washer 726 pressing the vibration wave motor 725 toward the front of the lens. The wave washer 726 is restricted from moving toward the mount by a washer 732 bayonet-coupled to the fixed tube 712, and a spring force (urging force) generated by the wave washer 726 is transmitted to the vibration wave motor 725 and then to the rollers 722 and also serves as a force for the manual focus ring 724 to press the mount-side end surface 712a of the fixed tube 712. In other words, the manual focus ring 724 is incorporated in the state of being pressed against the mount-side end surface 712a of the fixed tube 712 via the low-friction sheet 733.

Accordingly, when the vibration wave motor 725 is rotationally driven relative to the fixed tube 712 by the drive circuit, which contains a signal generation mechanism (not illustrated), since the junction member 729 is in frictional contact with the small diameter portion 722b of each roller 722, each roller 722 rotates around the shaft 720f. When each roller 722 rotates around the shaft 720f, as a result, the rotation transmission ring 720 rotates around the optical axis (auto-focus operation).

Moreover, when a rotational force around the optical axis is applied from a manual operation input portion (not illustrated) to the manual focus ring 724, the following operation is performed. First, since the mount-side end surface 724b of the manual focus ring 724 is in pressed contact with the large diameter portion 722a of each roller 722, each roller 722 is rotated around the shaft 720f by a frictional force. When the large diameter portion 722a of each roller 722 is rotated around the shaft 720f, the rotation transmission ring 720 rotates around the optical axis. At this time, the vibration wave motor 725 is prevented from rotating by a frictional holding force between the driven body 725c and the vibrator 725b (manual focus operation).

Two focus keys 728 are attached to the rotation transmission ring 720 at opposite positions thereof, and each focus key 728 is fitted in a cutout portion 715b provided in the fore-end of the cam ring 715. Accordingly, when the auto-focus operation or the manual focus operation is performed and the rotation transmission ring 720 is rotated around the optical axis, its rotating force is transmitted to the cam ring 715 via the focus keys 728. When the cam ring 715 is rotated around the optical axis, the rear lens group tube 716, which is restricted from rotation by the cam roller 717a and the rectilinear guide slot 713a, moves forward or backward along the cam groove 715a of the cam ring 715 via the cam roller 717b. With this, the focus lens 702 is driven, so that the focusing operation is performed. Thus, the position of the focus lens 702, which is an optical member, is varied by a mechanical connection to the vibration wave motor 725.

While, in the above description, an interchangeable lens barrel of a single-lens reflex camera has been descried as an optical apparatus in the present exemplary embodiment, the present exemplary embodiment can be applied to various optical apparatuses equipped with a vibration wave motor, irrespective of the types of cameras, such as a compact camera and an electronic still camera.

<Electronic Apparatus>

An electronic apparatus equipped with the above-described vibration wave motor can also be provided and can be used in various use applications.

EXAMPLES

Next, exemplary embodiments of the vibration wave motor, the drive control system, and the optical apparatus are described, while the some embodiments are not limited to the following exemplary embodiments.

Production Example of One Annular Piece of Piezoelectric Ceramics

One annular piece of piezoelectric ceramics with a lead content of less than 1000 ppm was produced from a barium titanate series material in the following manner.

With the intention to add Mn and Bi to $$(Ba_{0.86}Ca_{0.14})1.00(Ti_{0.94}Zr_{0.06})O_3,$$

which is equivalent the composition of x=0.14, y=0.06, and α=1.00 in the above-mentioned general formula (1), equivalent raw material powder was weighed as follows.

With use of, as raw material powder, barium titanate, calcium titanate, and calcium zirconate each of which has an average grain diameter of 300 nm or less and has a perovskite-type structure, weighing was performed in such a manner that Ba, Ca, Ti, and Zr became a composition of $$(Ba_{0.86}Ca_{0.14})1.00(Ti_{0.94}Zr_{0.06})O_3.$$

Barium carbonate and titanium oxide were used to adjust "x" indicating the molar ratio between the A-site and the B-site. Trimanganese tetroxide was added to 100 parts by weight of the composition $$(Ba_{0.86}Ca_{0.14})1.00(Ti_{0.94}Zr_{0.06})O_3$$

in such a manner that the content of Mn became 0.14 parts by weight in terms of metal. Likewise, bismuth oxide was added in such a manner that the content of Bi became 0.18 parts by weight in terms of metal.

These weighed powders were mixed by dry blending for 24 hours via a ball mill, so that mixed powder was obtained. To granulate the obtained mixed powder, a polyvinyl acetate (PVA) binder with 3 parts by weight relative to the mixed powder was attached to the surface of the mixed powder via a spray dryer device, so that granulated powder was obtained.

Next, the obtained granulated powder was put into a mold to produce a disc-shaped molded member with a molding pressure of 200 MPa applied by a press molding machine. The dimensions of the mold used for molding a disc-shaped member were set to have respective margins of 2 mm, 2 mm, and 0.5 mm with respect to the outer diameter, inner diameter, and thickness of a disc-shaped piece of piezoelectric ceramics serving as a target.

The obtained molded member was placed into an electric furnace, was held for 5 hours at the highest temperature of 1340° C., and was sintered in the air atmosphere for 24 hours in total. Next, the sintered product was subjected to grinding processing into an annular shape having an intended outer diameter, inner diameter, and thickness, so that one annular piece of piezoelectric ceramics with an outer diameter of 76.9 mm, and an inner diameter of 67.2 mm, and a thickness of 0.5 mm was obtained.

The composition of the piezoelectric ceramics was evaluated by ICP optical emission spectrometric analysis. As a result, the content of lead in the piezoelectric ceramics produced in the above-described way was less than 1 ppm in each case. Moreover, with results of ICP optical emission spectrometric analysis and X-ray diffraction measurement combined, it was found that the composition of the piezoelectric ceramics was a composition which had, as a principal component, a perovskite-type metal oxide able to be expressed by a composition of $$(Ba_{0.86}Ca_{0.14})1.00(Ti_{0.94}Zr_{0.06})O_3$$

and contained 0.14 parts by weight of Mn and 0.18 parts by weight of Bi relative to 100 parts by weight of the principal component.

Production Example of Vibration Plate

Figure 12A:
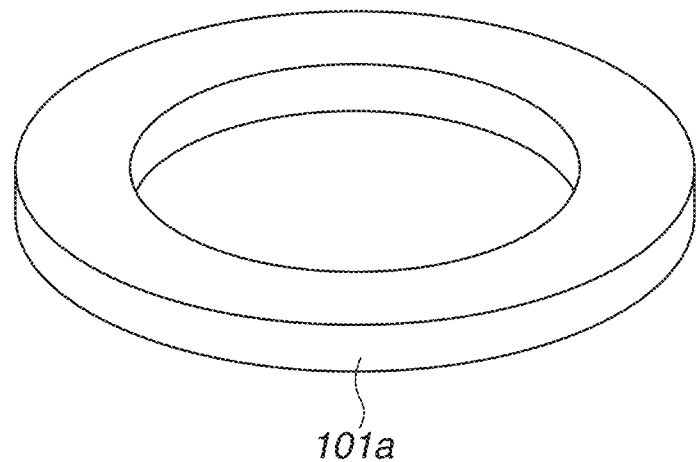
FIGS. 12A and 12B are schematic views illustrating an example of an annular vibration plate which is used in a vibration wave motor according to an exemplary embodiment.
Figure 12B:
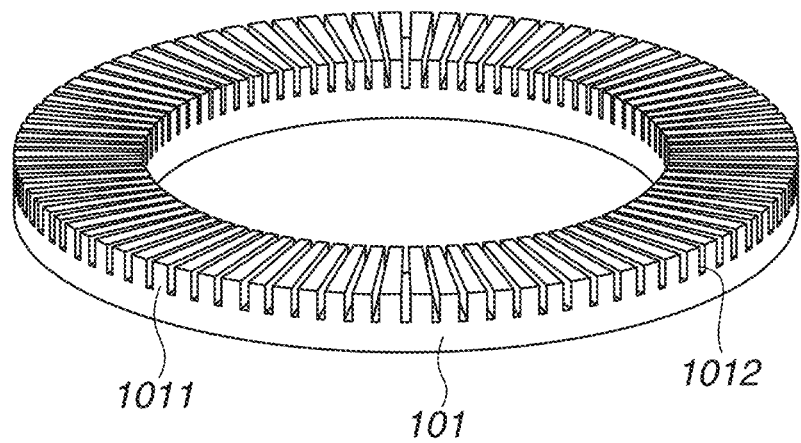

FIGS. 12A and 12B are schematic views illustrating an example of an annular vibration plate which is used in the vibration wave motor and the vibrator in an exemplary embodiment.

To produce a vibration plate for use in the exemplary embodiment, an annular metal plate 101a, such as that illustrated in FIG. 12A, was prepared. The metal plate 101a is formed from magnetic stainless steel SUS420J2 in the JIS standard. SUS420J2 is martensite stainless steel and is an alloy containing 70% by mass of steel and 12% to 14% by mass of chromium.

The outer diameter, inner diameter, and thickness of the metal plate 101a were set in such a manner that the metal plate 101a had an outer diameter 2R of 77.0 mm, an inner diameter of 67.1 mm, and thickness of 5.0 mm.

Next, on one side surface (second surface) of the annular metal plate 101a, groove portions 1012 at 90 places (X=90) were radially formed by mechanical grinding (grooving). Wall surfaces of each groove portion 1012 were made vertical as viewed from the first surface of the vibration plate 101, on which grooving was not performed. The groove bottom portion of each groove portion 1012 was made to have a gradient form, the center of which is deepest, as illustrated in FIG. 5C. The metal plate 101a after grooving was then subjected to barrel processing, lapping polishing, and electroless nickel plating processing, so that the vibration plate 101 for use in the vibrator 1 in the exemplary embodiment was obtained.

Since each groove portion 1012 of the vibration plate 101 was formed in the shape of a rectangular parallelepiped with a width of 1.0 mm as viewed from the second surface side, each protruding portion 1011 has a sector form, in which the width was wider at the outer diameter side of the circular ring.

The center depths D1 to D90 of the groove portions 1012 at 90 places of the vibration plate 101 were made to be the depths illustrated in FIG. 6F. Thus, the center depths D1 to D90 vary along a curve obtained by superposing four sine waves.

Moreover, the depth variation of the depths D1 to D45 and the depth variation of the depths D46 to D90 were as shown in Table 1. With such a configuration employed, unnecessary traveling waves other than the 7th degree traveling wave can be prevented or reduced.

TABLE 1

| Symbol of Center Depth of Groove Portion | Groove Depth [mm] |
| --- | --- |
| D1 | 2.133 |
| D2 | 2.051 |
| D3 | 1.783 |
| D4 | 1.567 |
| D5 | 1.574 |
| D6 | 1.758 |
| D7 | 1.948 |
| D8 | 2.024 |
| D9 | 2.013 |
| D10 | 2.000 |
| D11 | 1.991 |
| D12 | 1.910 |
| D13 | 1.724 |
| D14 | 1.536 |
| D15 | 1.512 |
| D16 | 1.712 |
| D17 | 1.995 |
| D18 | 2.144 |
| D19 | 2.070 |
| D20 | 1.894 |
| D21 | 1.808 |
| D22 | 1.868 |
| D23 | 1.942 |
| D24 | 1.871 |
| D25 | 1.663 |
| D26 | 1.505 |
| D27 | 1.576 |
| D28 | 1.857 |
| D29 | 2.139 |
| D30 | 2.220 |
| D31 | 2.084 |
| D32 | 1.877 |
| D33 | 1.744 |
| D34 | 1.701 |
| D35 | 1.679 |
| D36 | 1.655 |
| D37 | 1.698 |
| D38 | 1.864 |
| D39 | 2.077 |
| D40 | 2.157 |
| D41 | 2.004 |
| D42 | 1.727 |
| D43 | 1.568 |
| D44 | 1.676 |
| D45 | 1.951 |
| D46 | 2.133 |
| D47 | 2.051 |
| D48 | 1.783 |
| D49 | 1.567 |
| D50 | 1.574 |
| D51 | 1.758 |
| D52 | 1.948 |
| D53 | 2.024 |
| D54 | 2.013 |
| D55 | 2.000 |
| D56 | 1.991 |
| D57 | 1.910 |
| D58 | 1.724 |
| D59 | 1.536 |
| D60 | 1.512 |
| D61 | 1.712 |
| D62 | 1.995 |
| D63 | 2.144 |
| D64 | 2.070 |
| D65 | 1.894 |
| D66 | 1.808 |
| D67 | 1.868 |
| D68 | 1.942 |
| D69 | 1.871 |
| D70 | 1.663 |
| D71 | 1.505 |
| D72 | 1.576 |
| D73 | 1.857 |
| D74 | 2.139 |
| D75 | 2.220 |
| D76 | 2.084 |
| D77 | 1.877 |
| D78 | 1.744 |
| D79 | 1.701 |
| D80 | 1.679 |
| D81 | 1.655 |
| D82 | 1.698 |
| D83 | 1.864 |
| D84 | 2.077 |
| D85 | 2.157 |
| D86 | 2.004 |
| D87 | 1.727 |
| D88 | 1.568 |
| D89 | 1.676 |
| D90 | 1.951 |

Production Example of Vibrator

FIGS. 13A, 13B, 13C, 13D, and 13E are schematic process charts illustrating an example of a method for manufacturing a vibrator that is used in the vibration wave motor according to an exemplary embodiment.

A vibrator was manufactured by combining the piezoelectric ceramics described in the above-mentioned production example and the vibration plate in the previously-described exemplary embodiment.

Figure 13A:
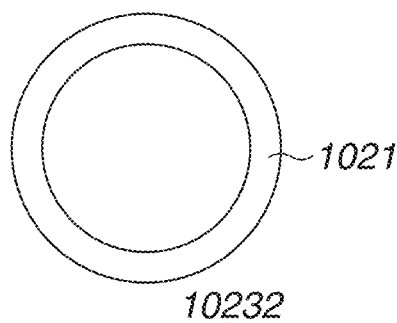
FIGS. 13A, 13B, 13C, 13D, and 13E are schematic process charts illustrating an example of a method for manufacturing an annular piezoelectric element which is used in a vibration wave motor according to an exemplary embodiment.
Figure 13B:
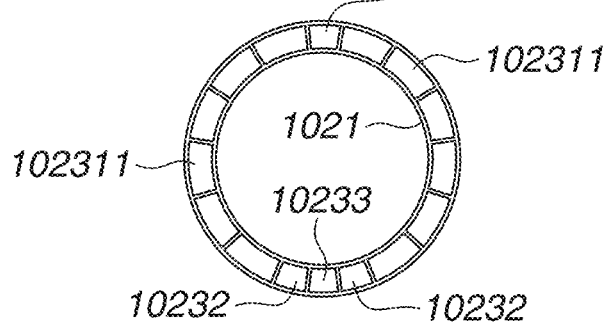
Figure 13C:
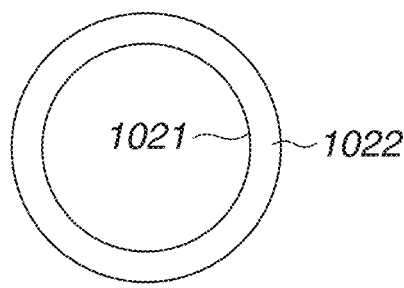

First, in an annular piece of piezoelectric ceramics 1021 illustrated in FIG. 13A, on one side surface thereof, a common electrode 1022 was formed by screen printing of silver paste as illustrated in FIG. 13C. On the other side surface thereof, polarization electrodes 102311 at 12 places, non-drive phase electrodes 10232 at three places, and a detection phase electrode 10233 at one place were formed, as illustrated in FIG. 13B. At this time, the interelectrode distance between every adjacent electrode illustrated in FIG. 13B was set to 0.5 mm.

Next, between the common electrode 1022 and the polarization electrodes 102311, non-drive phase electrodes 10232, and detection phase electrode 10233, poling processing was performed in the air with use of a direct-current power source in such a manner that expansion and contraction polarities of the piezoelectric element became as illustrated in FIG. 4A. The voltage was set to have such a magnitude as to apply an electric field of 1.0 kV/mm, and the temperature and the voltage application time were set to 100° C. and 60 minutes, respectively. Moreover, the voltage was applied until the temperature decreased to 40° C.

Figure 13D:
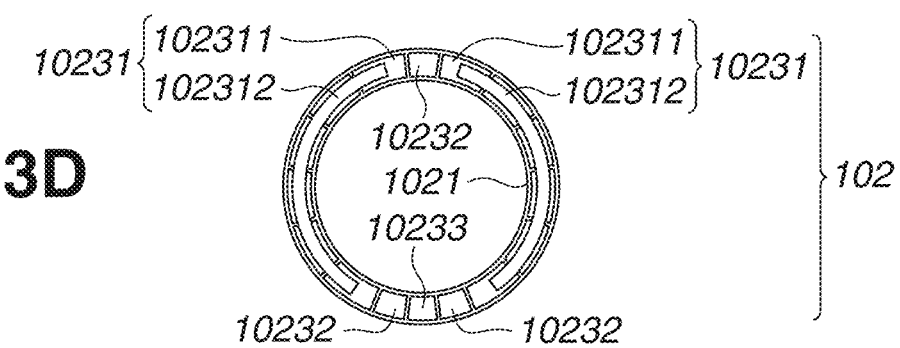

Next, as illustrated in FIG. 13D, to tether the polarization electrodes 102311, tether electrodes 102312 were formed with silver paste, and drive phase electrodes 10231 at two places were obtained by combining the polarization electrodes 102311 and the tether electrodes 102312, so that the piezoelectric element 102 was obtained. Drying of silver paste was performed at a temperature sufficiently lower than the depolarization temperature of the piezoelectric ceramics 1021. The resistance value of the drive phase electrode 10231 was measured by a multimeter (electrical tester). One piece of the tester was brought into contact with the surface of a portion of the polarization electrode 102311 closest to the detection phase electrode 10233, and the other piece of the tester was brought into contact with the surface of a portion of the polarization electrode 102311 most distant from the detection phase electrode 10233 in the circumferential direction of the annular shape in the drive phase electrodes 10231. As a result, the resistance value of the drive phase electrode 10231 was 0.6Ω.

Figure 13E:
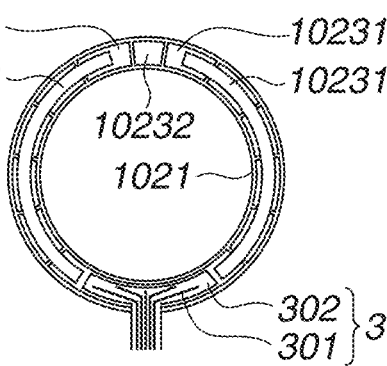

Next, as illustrated in FIG. 13E, regions covering the drive phase electrodes 10231 at two places, the non-drive phase electrodes 10232 at two places, and the detection phase electrode 10233 in the piezoelectric element 102 were focused on. A flexible printed circuit board 3 was pressure-bonded to these regions in a room-temperature process with use of a moisture-curable epoxy-based resin adhesive. The flexible printed circuit board 3 is a member intended to supply power to the above-mentioned electrodes and extract a detection signal, and includes electrical wiring 301, an insulative base film 302, and a connector portion (not illustrated) for connection to an external drive circuit.

Next, as illustrated in FIG. 1A, the piezoelectric element 102 is pressure-bonded to the first surface of the vibration plate 101 in a room-temperature process with use of a moisture-curable epoxy-based resin adhesive. The vibration plate 101 and the non-drive phase electrodes 10232 at three places are interconnected by short-circuited wiring (not illustrated) made from silver paste, so that the vibrator 1 was produced. Drying of silver paste was performed at a temperature sufficiently lower than the depolarization temperature of the piece of piezoelectric ceramics 1021.

<Checking of Prevention or Reduction of Unnecessary Traveling Waves and Checking of Positions of Unnecessary Standing Waves>

Next, alternating voltages were applied to the vibrator 1 obtained in the above-described production example while the frequencies thereof were being varied, and the resonant frequency and the wavenumbers and positions of bending vibration waves being generated were evaluated with use of an impedance analyzer and a laser Doppler vibrometer.

The measurement of the resonant frequency was performed in the A-phase of the drive phase electrode 10231. First, aiming at applying an alternating voltage to the A-phase electrode, the B-phase electrode and the detection phase electrode 10233 were short-circuited to the non-drive phase electrodes 10232 with use of the connector portion of the flexible printed circuit board 3, and the short-circuited portion was connected via wiring to the ground side of an external power source for evaluation.

An alternating voltage having a variable frequency and an amplitude of 10 V was applied to the A-phase electrode, and the impedance thereof was then measured at room temperature. The frequency was varied from the high frequency side, for example, 50 kHz, to the low frequency side, for example, 1 kHz.

FIG. 14 illustrates an impedance measurement result obtained at room temperature about the vibrator 1 using the piezoelectric ceramics and the vibration plate in the above-described examples. In FIG. 14, peaks of standing waves of a plurality of number-th degrees occur, and, in each number-th degree, a downward-facing peak (resonance) and an upward-facing peak (antiresonance) appear in pairs at near frequencies.

Here, the local minimal value of the downward-facing peak is assumed to be the resonant frequency. The wavenumbers and positions corresponding to the respective peaks were specified by actually measuring the vibration amplitudes of all of the protruding portions of the vibration plate with a laser Doppler vibrometer. The method of applying an alternating voltage was set to the same method as in measuring the impedance.

As a result, a plurality of downward-facing peaks appearing in the impedance curve illustrated in FIG. 14 were peaks corresponding to the generation of the 4th degree, 5th degree, 6th degree, 7th degree, and 8th degree standing waves caused by resonance.

Referring to FIG. 14, in the vibrator in the exemplary embodiment that uses the vibration plate in which the center depths of the groove portions vary according to the previously-described exemplary embodiment, only one intended 7th degree resonant frequency appeared, and unnecessary 4th degree, 5th degree, 6th degree, and 8th degree resonant frequencies appeared in two different frequencies. Thus, the occurrence of unnecessary traveling waves was prevented or reduced with respect to the occurrence of the intended 7th degree traveling wave.

Here, in the vibrator 1, as illustrated in FIG. 14, since the resonant frequencies serving as the 4th degree, 5th degree, 6th degree, and 8th degree standing waves appeared in two different frequencies, the position of a standing wave having a larger vibration amplitude in the standing waves of each number-th degree was checked.

As a result, the 4th degree unnecessary standing wave occurred at 8.4 kHz, and the position of the antinode portion thereof almost corresponded to the deep portion of the groove illustrated in FIG. 7A. Moreover, the 5th degree unnecessary standing wave occurred at 13.4 kHz, and the position of the antinode portion thereof almost corresponded to the deep portion of the groove illustrated in FIG. 7B. Moreover, the 6th degree unnecessary standing wave occurred at 19.4 kHz, and the position of the antinode portion thereof almost corresponded to the deep portion of the groove illustrated in FIG. 7C. Moreover, the 8th degree unnecessary standing wave occurred at 33.8 kHz, and the position of the antinode portion thereof almost corresponded to the deep portion of the groove illustrated in FIG. 7D.

Production Example 1 of Vibration Damping Member

To produce a vibration damping member which is used in an exemplary embodiment, an annular felt (manufactured by Toray Industries, Inc., product name: GS Felt) was prepared. The outer diameter, inner diameter, and thickness of the vibration damping member were set in such a manner that the outer diameter was 71.2 mm, the inner diameter was 67.2 mm, and the thickness was 1 mm.

Next, aiming at preventing or reducing the 6th degree unnecessary standing wave, the prepared annular vibration damping member was cut radially into parts, each of which had a length of ⅛ of the wavelength $P_6$ of the 6th degree unnecessary standing wave in the circumferential direction centering on the position equivalent to the deep portion of the groove illustrated in FIG. 7C.

Figure 15A:
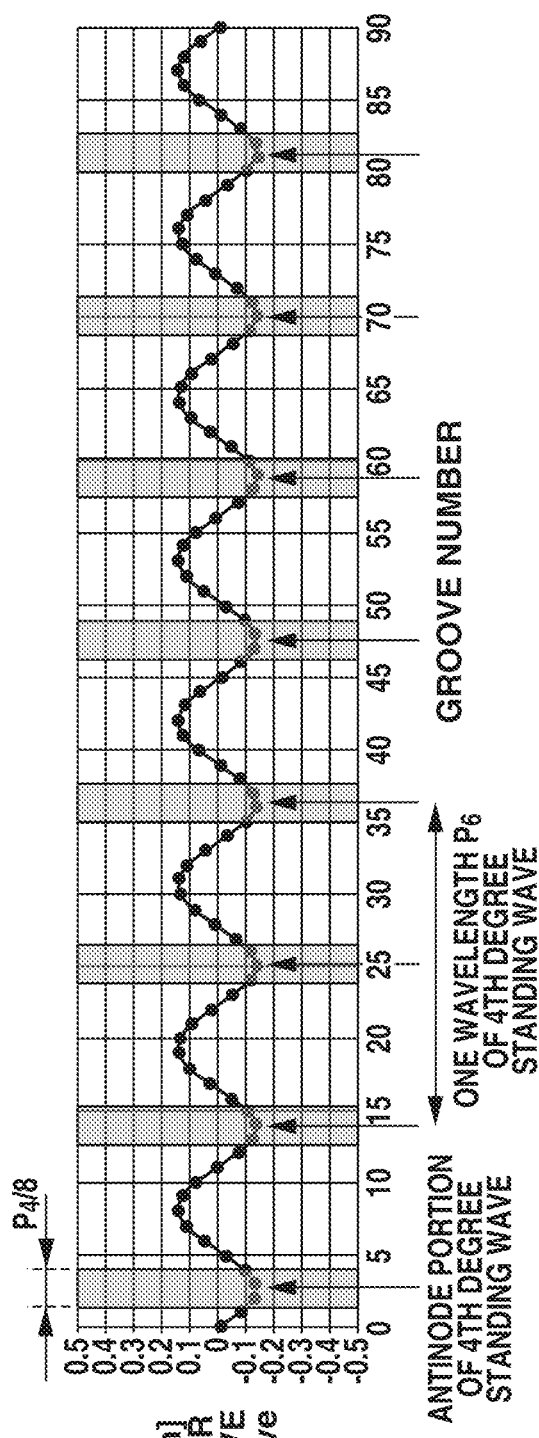
Figure 15B:
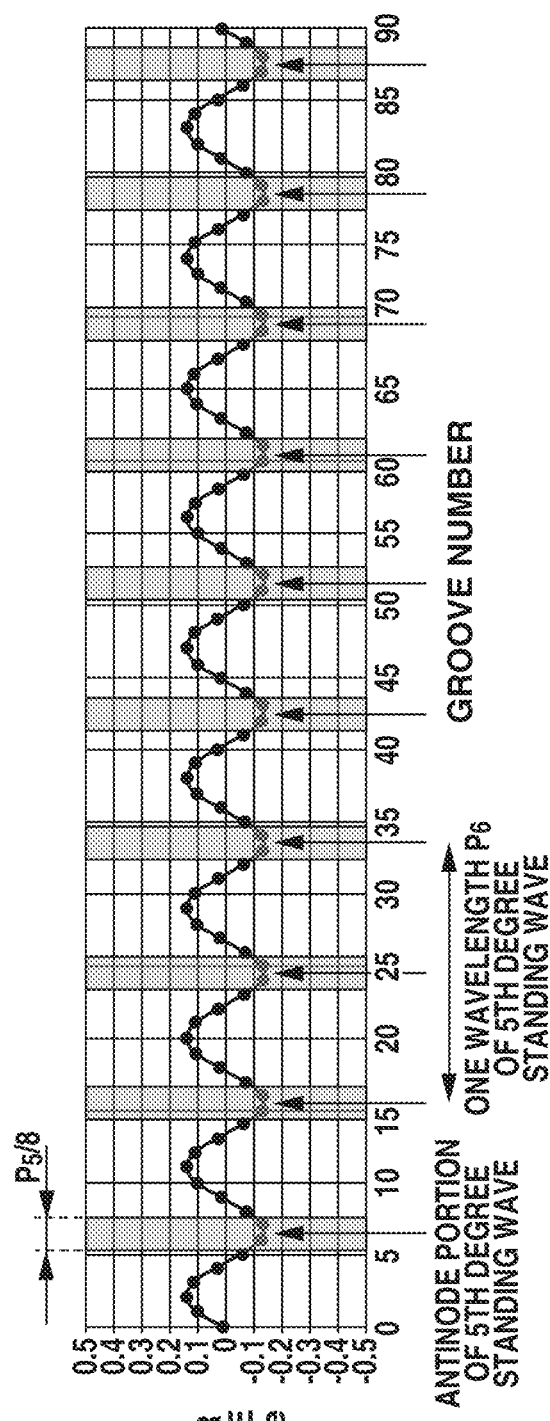

FIG. 15C illustrates, by shaded areas, the positions that correspond to the length of ⅛ of the wavelength $P_6$ of the 6th degree standing wave in the circumferential direction centering on the position equivalent to the deep portion of the groove illustrated in FIG. 7C.

The positions of the shaded areas on this graph are equivalent to antinode portions and their neighborhoods of a standing wave which is generated when the vibration wave motor is driven.

Each of the vibration damping members G1 produced in the above-described way has a sector form in which the width was wider at the outer diameter side of the circular ring.

The produced vibration damping members G1 were bonded to the surface at the side of the piezoelectric element of the vibrator 1 at the positions corresponding to the shaded areas illustrated in FIG. 15C using a moisture-curable epoxide-based resin adhesive. With the vibration damping members G1 arranged in this way, pressure can be applied to the regions equivalent to the antinodes of the unnecessary standing wave, so that unnecessary standing waves can be effectively prevented or reduced.

Production Example 2 of Vibration Damping Member

Next, other vibration damping members G2 were produced with use of a felt and a manufacturing method similar to those in the vibration damping members G1. However, the vibration damping members G2 were parts obtained by radial cutting, each of which had a length of ⅛ of the wavelength of the 4th degree, 5th degree, 6th degree, or 8th degree standing wave in the circumferential direction centering on the position equivalent to the deep portion of the groove illustrated in FIG. 7A, 7B, 7C, or 7D, respectively. FIGS. 15A, 15B, 15C, and 15D illustrate, by shaded areas, the positions of the respective vibration damping members. The positions of the shaded areas on these graphs are equivalent to antinode portions and their neighborhoods of a standing wave that is generated when the vibration wave motor is driven.

Figure 16:
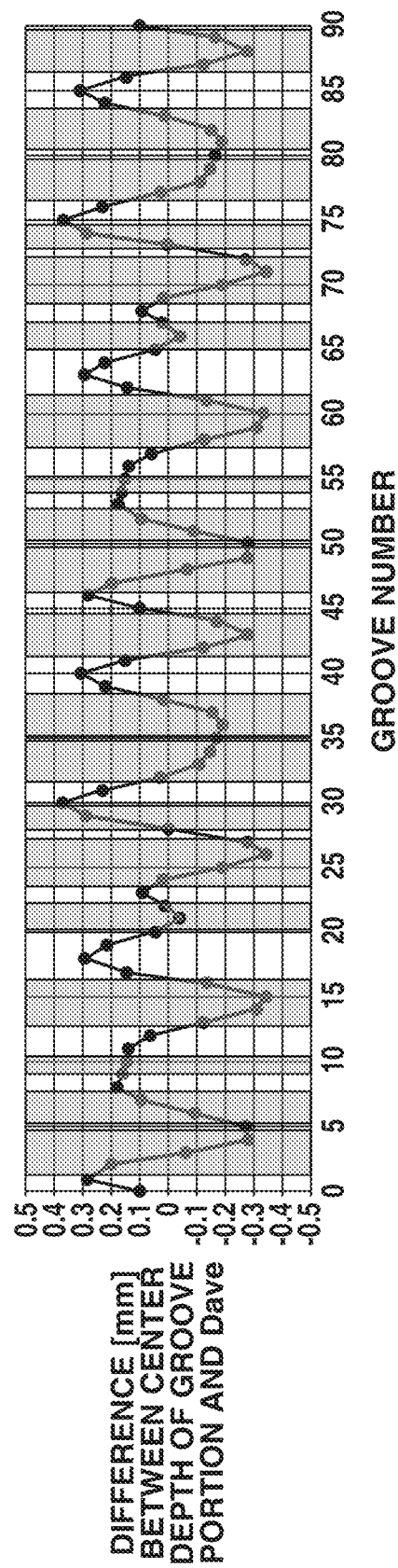
FIG. 16 is a schematic view illustrating mounting positions of a vibration damping member which is used in a vibration wave motor according to an exemplary embodiment.

The vibration damping members were parts which were obtained by cutting in such a manner that the vibration damping members were placed in positions that superpose these shaded areas. FIG. 16 illustrates, by shaded areas, the positions of the vibration damping members. A solid line in FIG. 16 is the same as that illustrated in FIG. 6E, thus representing the groove depths of the vibrator 1. In this way, the vibration damping members G2 were produced.

The produced vibration damping members G2 were bonded to the surface at the side of the piezoelectric element of the vibrator 1 at the positions corresponding to the shaded areas illustrated in FIG. 16 with use of a moisture-curable epoxide-based resin adhesive. With the vibration damping members G2 arranged in this way, pressure can be applied to the regions equivalent to antinodes of the unnecessary standing wave, so that unnecessary standing waves can be effectively prevented or reduced.

Production Example of Conventional Vibration Damping Member

Moreover, for use in the vibration wave motor in an exemplary embodiment and a vibration wave motor for comparison, a vibration damping member RG1 was produced using a felt and a manufacturing method similar to those in the vibration damping members G1. However, the vibration damping member RG1 was kept in a single piece of an annular shape without being cut.

Production Example 1 of Pressure Member

To produce a pressure member which is used in the vibration wave motor in an exemplary embodiment, two annular SUS plates and a wave washer, which is to be sandwiched therebetween, were prepared. The outer diameter, inner diameter, and thickness of the annular SUS plate were set in such a manner that the outer diameter was 71.2 mm, the inner diameter was 67.2 mm, and the thickness was 1 mm. Moreover, the annular plate spring (wave washer) was set to have an outer diameter of 71.2 mm and an inner diameter of 67.2 mm and to have such a hardness that the amount of deflection is 0.5 mm in response to 10 N.

Next, to prevent or reduce the 6th degree unnecessary standing wave, press working was performed on one of the above-mentioned annular SUS plates in such a manner that the positions of the shaded areas illustrated in FIG. 15C became raised portions 5021 with a height of 1 mm.

Next, the SUS plate that was subjected to press working, the annular plate spring, and the annular SUS plate were superposed in this order, so that a pressure member K1 was produced.

The produced pressure member K1 was bonded to one side surface of the vibration damping member RG1 using a moisture-curable epoxide-based resin adhesive in such a manner that the raised portions of the pressure member K1 correspond to the positions of the antinode portions of a standing wave illustrated in FIG. 15C in the vibrator.

Production Example 2 of Pressure Member

Next, a pressure member K2 was produced using members and a manufacturing method similar to those in the pressure member K1. However, to prevent or reduce the 4th degree, 5th degree, 6th degree, and 8th degree unnecessary standing waves, press working was performed on the pressure member K2 in such a manner that the positions of the shaded areas illustrated in FIG. 16 became raised portions with a height of 1 mm. The produced pressure member K2 was bonded to the surface at the piezoelectric element side of the vibrator 1 with use of a moisture-curable epoxide-based resin adhesive in such a manner that the raised portions of the pressure member K2 corresponded to the positions of shaded areas illustrated in FIG. 16.

Production Example of Conventional Pressure Member

Moreover, for use in the vibration wave motor in an exemplary embodiment and a vibration wave motor for comparison, a pressure member RK1 was produced using members and a manufacturing method similar to those in the pressure members K1. However, press working was not performed, and the SUS plate was kept in a flat plate shape without raised portions.

Production Example of Driven Body

The outer diameter, inner diameter, and thickness of the metal plate 101a were set in such a manner that the metal plate 101a had an outer diameter 2R of 77.0 mm, an inner diameter of 67.1 mm, and thickness of 5.0 mm.

For use in the vibration wave motor in the present exemplary embodiment and a vibration wave motor for comparison, an annular driven body 2 with an outer diameter of 77.0 mm, an inner diameter of 67.1 mm, and a thickness of 5 mm was produced.

An aluminum metal was used as the material of the driven body, the form thereof was shaped by block machining, and the surface thereof was subjected to alumite treatment.

Production Examples and Comparative Examples of Vibration Wave Motors

As illustrated in FIG. 1A and FIG. 2, the driven body 2, the vibrator 1, the vibration damping member, and the pressure member were superposed in this order, and the driven body 2 was brought into pressed contact with the second surface of the vibrator 1 by the pressure member, so that vibration wave motors P, Q, R, and S in the present exemplary embodiment were produced. Similarly, a vibration wave motor T for comparison was produced. In any vibration wave motor, the pressure force was set to 1.5 kgf.

Combinations of the vibration damping members G1, G2, and RG1 and the pressure members K1, K2, and RK1, which were used in the vibration wave motors in some of the exemplary embodiments, and the vibration wave motor for comparison, are shown in Table 2.

TABLE 2

|  |  | Vibration Damping Member | Pressure Member |
|---|---|---|---|
| Vibration Wave Motor P | Example 1 | G1 | RK1 |
| Vibration Wave Motor Q | Example 2 | G2 | RK1 |
| Vibration Wave Motor R | Example 3 | RG1 | K1 |
| Vibration Wave Motor S | Example 4 | RG1 | K2 |
| Vibration Wave Motor T | Comparative Example 1 | RG1 | RK1 |

Production Example and Comparative Example of Drive Control Systems

Next, in some embodiments, the drive phase electrodes 10231, the non-drive phase electrodes 10232, which were short-circuited to the common electrode 1022, and the detection phase electrode 10233 in the vibration wave motor were electrically connected to an external drive circuit with use of the connector portion of the flexible printed circuit board 3. In this way, a drive control system having a configuration such as that illustrated in FIG. 9 was produced. The external drive circuit includes a control mechanism for driving the vibration wave motor and a signal generation mechanism for outputting an alternating voltage for generating the 7th degree bending vibration wave in response to an instruction from the control mechanism.

Similarly, a drive control system for comparison was produced, and the driving experiments of the drive control system in an exemplary embodiment and the drive control system for comparison were performed.

A load was applied to the driven body 2 in such a way as to have a load of 150 gf·cm (about 1.5 N·cm), and an alternating voltage with an amplitude of 70 V was applied to the A-phase and the B-phase. The frequency was fixed to 27 kHz and the alternating voltage was applied to the A-phase and the B-phase with a temporal phase difference of $\pi/2$ in any of the drive control systems.

At that time, results obtained by performing fast Fourier transform (FFT) analysis on voltage signals output from the detection phase electrode are shown in Table 3. In each of the vibration wave motors P, Q, R, S, and T, voltage values in frequencies of the 4th degree, 5th degree, 6th degree, and 8th degree unnecessary standing waves are expressed by percent as the rate of change relative to a voltage signal output in the case of the vibration wave motor T. However, the first digit was rounded off. Moreover, abnormal noise generated from the drive control system at that time was also measured. In measurements of abnormal noise, a sound pressure level can be detected by analyzing data recorded with an external microphone connected to a general frequency analyzer (for example, SA-02M manufactured by Rion Co., Ltd.). Specifically, in a frequency range of 20 Hz to 20 kHz, which is the human audible range, a sound pressure level (A-characteristic sound pressure level) subjected to A-characteristic correction defined in the Japanese Industrial Standards (JIS C 1502-1990) in normal sound level meters was measured. The A-characteristic sound pressure level as used here is defined in the above-mentioned Japanese Industrial Standards, and is a frequency weighting characteristic that is based on the human auditory property, in which, even with physically the same sound pressure, the magnitude of sound which humans feel differs depending on frequencies. In the present measurement, a microphone for measurement was placed at a position 2 cm away from the vibrator. Results obtained by measurement are shown in Table 3.

TABLE 3

|  | Vibration Wave Motor P Example 1 | Vibration Wave Motor Q Example 2 | Vibration Wave Motor R Example 3 |
|---|---|---|---|
| Vibration Damping Member | G1 | G2 | RG1 |
| Pressure Member | RK1 | RK1 | K1 |
| Output Voltage from Detection Phase of 4th Degree Unnecessary Standing Wave (%) | 100 | 70 | 100 |
| Output Voltage from Detection Phase of 5th Degree Unnecessary Standing Wave (%) | 90 | 60 | 90 |
| Output Voltage from Detection Phase of 6th Degree Unnecessary Standing Wave (%) | 50 | 50 | 40 |
| Output Voltage from Detection Phase of 8th Degree Unnecessary Standing Wave (%) | 90 | 70 | 100 |
| Sound Pressure Level (dB) | 4 | 2 | 4 |

|  | Vibration Wave Motor S Example 4 | Vibration Wave Motor T Comparative Example 1 |
|---|---|---|
| Vibration Damping Member | RG1 | RG2 |
| Pressure Member | K2 | RK1 |
| Output Voltage from Detection Phase of 4th Degree Unnecessary Standing Wave (%) | 50 | 100 |
| Output Voltage from Detection Phase of 5th Degree Unnecessary Standing Wave (%) | 50 | 100 |
| Output Voltage from Detection Phase of 6th Degree Unnecessary Standing Wave (%) | 40 | 100 |
| Output Voltage from Detection Phase of 8th Degree Unnecessary Standing Wave (%) | 70 | 100 |
| Sound Pressure Level (dB) | 2 | 20 |

Abnormal noise during driving of the drive control system using the vibration wave motor in the present exemplary embodiment was prevented or reduced as compared with the drive control system using the vibration wave motor for comparison.

Production Example of Optical Apparatus

With use of the drive control system using the vibration wave motor P, Q, R, or S, an optical apparatus illustrated FIGS. 10A and 10B and FIG. 11 was produced, and an auto-focus operation performed in response to the application of an alternating voltage was checked. In any optical apparatus, abnormal noise during driving was not generated.

According to the present exemplary embodiment, a vibration wave motor which rotates a driven body by, for example, the 7th degree bending vibration wave and which is capable of attaining a sufficient driving speed and preventing or reducing the generation of abnormal noise, and a drive control system and an optical apparatus which use the vibration wave motor can be provided. Lead-free piezoelectric ceramics, which are high in environment safety, can also be employed.

While the present disclosure has described exemplary embodiments, it is to be understood that the claims are not limited to the disclosed exemplary embodiments. The scope of the following claims is to be accorded the broadest interpretation so as to encompass all such modifications and equivalent structures and functions.

This application claims the benefit of Japanese Patent Applications No. 2017-214156, filed Nov. 6, 2017, and No. 2018-185422, filed Sep. 28, 2018, which are hereby incorporated by reference herein in their entirety.

What is claimed is:

1. A vibration wave motor comprising:
   a driven body;
   a vibrator including an annular vibration plate and an annular piezoelectric element; and
   a vibration damping member, which are arranged in sequence,
   wherein the annular vibration plate has, on a side facing the driven body, a plurality of groove portions extending radially from a center of the vibration plate, at least one of the plurality of groove portions is different in depth from other groove portions of the plurality of groove portions, and the vibrator is pressed by the vibration damping member in a non-uniform manner,
   wherein the vibrator is pressed by the vibration damping member more strongly in some or all of antinode portions of a standing wave occurring when the vibration wave motor is driven than in portions other than the antinode portions of the standing wave.

2. The vibration wave motor according to claim 1, wherein the vibration plate and the vibration damping member are fixed to each other in a circumferential arrangement.

3. The vibration wave motor according to claim 1, wherein the piezoelectric element includes
   two drive phase electrodes,
   non-drive phase electrodes, and
   a detection phase electrode.

4. The vibration wave motor according to claim 3, wherein, when a length of one of seven arcs obtained by equally dividing a circumference of the annular piezoelectric element is denoted by $\lambda$, a length of each of the two drive phase electrodes in a circumferential direction is $3\lambda$, the two drive phase electrodes are separated from each other in the circumferential direction by two interval portions having lengths of $\lambda/4$ and $3\lambda/4$ in the circumferential direction, and the non-drive phase electrodes and the detection phase electrode are provided at the two interval portions.

5. The vibration wave motor according to claim 1, wherein a content of lead in a piece of piezoelectric ceramics included in the piezoelectric element is less than 1000 ppm.

6. The vibration wave motor according to claim 5, wherein the piece of piezoelectric ceramics is made from a barium titanate series material.

7. The vibration wave motor according to claim 1, wherein contact portions between the vibration damping member and the piezoelectric element are separated at a plurality of places.

8. The vibration wave motor according to claim 1, further comprising a pressure member configured to press the vibration plate against the driven body via the vibration damping member,
   wherein the pressure member has raised portions at places where the antinode portions of the standing wave are pressed.

9. A drive control system comprising:
   the vibration wave motor according to claim 1; and
   a drive circuit electrically connected to the vibration wave motor.

10. An optical apparatus comprising:
    the drive control system according to claim 9; and
    an optical member supported by the vibration wave motor.

11. An electronic apparatus comprising the vibration wave motor according to claim 1.

12. A vibration wave motor comprising:
    a driven body;
    a vibrator including an annular vibration plate and an annular piezoelectric element; and
    a vibration damping member, which are arranged in sequence,
    wherein the annular vibration plate has, on a side facing the driven body, a plurality of groove portions extending radially from a center of the vibration plate, at least one of the plurality of groove portions is different in depth from other groove portions of the plurality of groove portions, and the vibrator is pressed by the vibration damping member in a non-uniform manner,
    wherein the vibration plate has, on the side facing the driven body, radially extending groove portions at X places, wherein X is a positive integer, and, when center depths of the groove portions at X places are sequentially denoted by D1 to DX in a circumferential direction, D1 to DX vary along a curve obtained by superposing one or more sine waves,
    wherein application of pressure by the vibration damping member is set locally stronger in some or all of the antinode portions of the sine waves.

* * * * *